(12) United States Patent
Veerasamy

(10) Patent No.: US 10,145,005 B2
(45) Date of Patent: Dec. 4, 2018

(54) TECHNIQUES FOR LOW TEMPERATURE DIRECT GRAPHENE GROWTH ON GLASS

(71) Applicant: Guardian Glass, LLC, Auburn Hills, MI (US)

(72) Inventor: Vijayen S. Veerasamy, Ann Arbor, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 0 days.

(21) Appl. No.: 15/172,511

(22) Filed: Jun. 3, 2016

(65) Prior Publication Data

US 2017/0051399 A1 Feb. 23, 2017

Related U.S. Application Data

(60) Provisional application No. 62/207,132, filed on Aug. 19, 2015.

(51) Int. Cl.
*B32B 38/10* (2006.01)
*C23C 14/48* (2006.01)
(Continued)

(52) U.S. Cl.
CPC ............ *C23C 14/48* (2013.01); *C01B 32/186* (2017.08); *C01B 32/194* (2017.08);
(Continued)

(58) Field of Classification Search
CPC ..... B32B 38/10; B32B 43/006; Y10T 156/11; Y10T 156/1168; Y10T 156/19; C01B 31/0453
(Continued)

(56) References Cited

U.S. PATENT DOCUMENTS

| 49,167 A | 1/1865 | Stetson |
|---|---|---|
| 1,370,974 A | 3/1921 | Kirlin |

(Continued)

FOREIGN PATENT DOCUMENTS

| CA | 2283502 | 9/1998 |
|---|---|---|
| CN | 101299443 A | 11/2008 |

(Continued)

OTHER PUBLICATIONS

Product Data Sheet for Precision Spheres for BGAs (PGBA, CBGA, and TBGA), Indium Corporation of America (4 pp.).

(Continued)

*Primary Examiner* — Mark A Osele
*Assistant Examiner* — Nickolas R Harm
(74) *Attorney, Agent, or Firm* — Nixon & Vanderhye P.C.

(57) ABSTRACT

Certain example embodiments relate to methods for low temperature direct graphene growth on glass, and/or associated articles/devices. In certain example embodiments, a glass substrate has a layer including Ni formed thereon. The layer including Ni has a stress pre-engineered through the implantation of He therein. It also may be preconditioned via annealing and/or the like. A remote plasma-assisted chemical vapor deposition technique is used to form graphene both above and below the Ni-inclusive film. The Ni-inclusive film and the top graphene may be removed via tape and/or the like, leaving graphene on the substrate. Optionally, a silicon-inclusive layer may be formed between the Ni-inclusive layer and the substrate. Products including such articles, and/or methods of making the same, also are contemplated.

19 Claims, 11 Drawing Sheets

(51) Int. Cl.
  *C23C 14/22* (2006.01)
  *C23C 16/06* (2006.01)
  *C23C 16/24* (2006.01)
  *C23C 16/50* (2006.01)
  *C23C 16/56* (2006.01)
  *C01B 32/186* (2017.01)
  *C01B 32/194* (2017.01)
  *B32B 43/00* (2006.01)

(52) U.S. Cl.
  CPC ............ *C23C 14/221* (2013.01); *C23C 16/06* (2013.01); *C23C 16/24* (2013.01); *C23C 16/50* (2013.01); *C23C 16/56* (2013.01); *B32B 38/10* (2013.01); *B32B 43/006* (2013.01); *Y10T 156/11* (2015.01); *Y10T 156/1168* (2015.01); *Y10T 156/19* (2015.01)

(58) Field of Classification Search
  USPC .................................. 156/247, 701, 714, 750
  See application file for complete search history.

(56) References Cited

U.S. PATENT DOCUMENTS

| | | |
|---|---|---|
| 1,448,351 A | 3/1923 | Kirlin |
| 1,774,860 A | 9/1930 | Wendler et al. |
| 2,011,557 A | 8/1935 | Anderegg |
| 2,303,897 A | 12/1942 | Smith |
| 2,962,409 A | 11/1960 | Ludlow et al. |
| 3,441,924 A | 4/1969 | Peek et al. |
| 3,742,600 A | 7/1973 | Lowell |
| 3,857,161 A | 12/1974 | Hutchins, IV |
| 3,902,883 A | 9/1975 | Bayer |
| 3,912,365 A | 10/1975 | Lowell |
| 3,936,553 A | 2/1976 | Rowe |
| 3,959,577 A | 5/1976 | Frink |
| 3,990,201 A | 11/1976 | Falbel |
| 4,064,300 A | 12/1977 | Bhangu |
| 4,130,408 A | 12/1978 | Crossland et al. |
| 4,130,452 A | 12/1978 | Indri |
| 4,305,982 A | 12/1981 | Hirsch |
| 4,393,105 A | 7/1983 | Kreisman |
| 4,422,280 A | 12/1983 | Mertin et al. |
| 4,486,482 A | 12/1984 | Kobayashi et al. |
| 4,514,450 A | 4/1985 | Nowobilski et al. |
| 4,542,611 A | 9/1985 | Day |
| 4,586,289 A | 5/1986 | Jaeger |
| 4,598,520 A | 7/1986 | Ellstrom |
| RE32,272 E | 10/1986 | Funaki et al. |
| 4,683,154 A | 7/1987 | Benson et al. |
| 4,780,164 A | 10/1988 | Rueckheim et al. |
| 4,786,344 A | 11/1988 | Beuther |
| 4,822,649 A | 4/1989 | Canaud et al. |
| 4,824,215 A | 4/1989 | Joseph et al. |
| 4,853,264 A | 8/1989 | Vincent et al. |
| 4,865,672 A | 9/1989 | Delbeck et al. |
| 4,874,461 A | 10/1989 | Sato et al. |
| 4,886,095 A | 12/1989 | Lisec |
| 4,909,874 A | 3/1990 | Rueckheim |
| 4,909,875 A | 3/1990 | Canaud et al. |
| 4,924,243 A | 5/1990 | Sato et al. |
| 4,928,448 A | 5/1990 | Phillip |
| 4,983,429 A | 1/1991 | Takayanagi et al. |
| 5,005,557 A | 4/1991 | Bachli |
| 5,017,252 A | 5/1991 | Aldrich et al. |
| 5,027,574 A | 7/1991 | Phillip |
| 5,124,185 A | 6/1992 | Kerr et al. |
| 5,157,893 A | 10/1992 | Benson et al. |
| 5,175,975 A | 1/1993 | Benson et al. |
| 5,227,038 A | 7/1993 | Smalley et al. |
| 5,234,738 A | 8/1993 | Wolf |
| 5,247,764 A | 9/1993 | Jeshurun et al. |
| 5,270,084 A | 12/1993 | Parker |
| 5,271,973 A | 12/1993 | Huether |
| 5,300,203 A | 4/1994 | Smalley |
| 5,313,761 A | 5/1994 | Leopold |
| 5,315,797 A | 5/1994 | Glover et al. |
| 5,366,574 A | 11/1994 | Lenhardt et al. |
| 5,399,406 A | 3/1995 | Matsuo et al. |
| 5,489,321 A | 2/1996 | Tracy et al. |
| 5,494,715 A | 2/1996 | Glover |
| 5,499,128 A | 3/1996 | Hasegawa et al. |
| 5,556,517 A | 9/1996 | Smalley |
| 5,591,312 A | 1/1997 | Smalley |
| 5,596,891 A | 1/1997 | Soucy |
| 5,650,597 A | 7/1997 | Redmayne |
| 5,657,607 A | 8/1997 | Collins et al. |
| 5,664,395 A | 9/1997 | Collins et al. |
| 5,739,376 A | 4/1998 | Bingel |
| 5,739,882 A | 4/1998 | Shimizu et al. |
| 5,753,069 A | 5/1998 | Rueckheim |
| 5,855,638 A | 1/1999 | Demars |
| 5,891,536 A | 4/1999 | Collins et al. |
| 5,897,927 A | 4/1999 | Tsai et al. |
| 5,902,652 A | 5/1999 | Collins et al. |
| 6,049,370 A | 4/2000 | Smith, Jr. et al. |
| 6,123,824 A | 9/2000 | Sano et al. |
| 6,129,901 A | 10/2000 | Moskovits et al. |
| 6,162,926 A | 12/2000 | Murphy et al. |
| 6,177,918 B1 | 1/2001 | Colgan et al. |
| 6,183,714 B1 | 2/2001 | Smalley et al. |
| 6,204,897 B1 | 3/2001 | Colgan et al. |
| 6,288,325 B1 | 9/2001 | Jansen et al. |
| 6,383,580 B1 | 5/2002 | Aggas |
| 6,399,785 B1 | 6/2002 | Murphy et al. |
| 6,448,412 B1 | 10/2002 | Murphy et al. |
| 6,468,610 B1 | 10/2002 | Morimoto et al. |
| 6,506,472 B1 | 1/2003 | Yoshinori et al. |
| 6,538,153 B1 | 3/2003 | Hirsch et al. |
| 6,602,371 B2 | 8/2003 | Veerasamy et al. |
| 6,613,603 B1 | 9/2003 | Sano |
| 6,645,455 B2 | 11/2003 | Margrave et al. |
| RE38,358 E | 12/2003 | Petrmichl |
| 6,683,783 B1 | 1/2004 | Smalley et al. |
| 6,692,717 B1 | 2/2004 | Smalley et al. |
| 6,749,827 B2 | 6/2004 | Smalley et al. |
| 6,752,977 B2 | 6/2004 | Smalley et al. |
| 6,756,025 B2 | 6/2004 | Colbert et al. |
| 6,756,026 B2 | 6/2004 | Colbert et al. |
| 6,761,870 B1 | 7/2004 | Smalley et al. |
| 6,784,361 B2 | 8/2004 | Carlson et al. |
| 6,790,425 B1 | 9/2004 | Smalley et al. |
| 6,808,606 B2 | 10/2004 | Thomsen et al. |
| 6,824,755 B2 | 11/2004 | Colbert et al. |
| 6,827,918 B2 | 12/2004 | Margrave et al. |
| 6,835,366 B1 | 12/2004 | Margrave et al. |
| 6,852,410 B2 | 2/2005 | Veedu et al. |
| 6,863,942 B2 | 3/2005 | Ren et al. |
| 6,875,412 B2 | 4/2005 | Margrave et al. |
| 6,890,506 B1 | 5/2005 | Harutyunyan et al. |
| 6,899,945 B2 | 5/2005 | Smalley et al. |
| 6,900,264 B2 | 5/2005 | Kumar et al. |
| 6,913,789 B2 | 7/2005 | Smalley et al. |
| 6,936,233 B2 | 8/2005 | Smalley et al. |
| 6,936,653 B2 | 8/2005 | McElrath et al. |
| 6,939,525 B2 | 9/2005 | Colbert et al. |
| 6,946,171 B1 | 9/2005 | Aggas |
| 6,949,237 B2 | 9/2005 | Smalley et al. |
| 6,841,139 B2 | 11/2005 | Margrave et al. |
| 6,969,504 B2 | 11/2005 | Smalley et al. |
| 6,979,709 B2 | 12/2005 | Smalley et al. |
| 6,986,876 B2 | 1/2006 | Smalley et al. |
| 7,008,563 B2 | 3/2006 | Smalley et al. |
| 7,008,604 B2 | 3/2006 | Smalley et al. |
| 7,014,737 B2 | 3/2006 | Harutyunyan et al. |
| 7,029,646 B2 | 4/2006 | Margrave et al. |
| 7,041,620 B2 | 5/2006 | Smalley et al. |
| 7,048,903 B2 | 5/2006 | Colbert et al. |
| 7,048,999 B2 | 5/2006 | Smalley et al. |
| 7,052,666 B2 | 5/2006 | Colbert et al. |
| 7,052,668 B2 | 5/2006 | Smalley et al. |
| 7,061,749 B2 | 6/2006 | Liu et al. |
| 7,067,098 B2 | 6/2006 | Colbert et al. |
| 7,070,754 B2 | 7/2006 | Smalley et al. |

(56) References Cited

U.S. PATENT DOCUMENTS

| | | |
|---|---|---|
| 7,070,810 B2 | 7/2006 | Hirsch et al. |
| 7,071,406 B2 | 7/2006 | Smalley et al. |
| 7,074,310 B2 | 7/2006 | Smalley et al. |
| 7,087,207 B2 | 8/2006 | Smalley et al. |
| 7,090,819 B2 | 8/2006 | Smalley et al. |
| 7,097,820 B2 | 8/2006 | Colbert et al. |
| 7,105,596 B2 | 9/2006 | Smalley et al. |
| 7,108,841 B2 | 9/2006 | Smalley et al. |
| 7,109,581 B2 | 9/2006 | Dangelo et al. |
| 7,115,864 B2 | 10/2006 | Colbert et al. |
| 7,125,502 B2 | 10/2006 | Smalley et al. |
| 7,125,534 B1 | 10/2006 | Smalley et al. |
| 7,135,160 B2 | 11/2006 | Yang et al. |
| 7,138,100 B2 | 11/2006 | Smalley et al. |
| 7,150,864 B1 | 12/2006 | Smalley et al. |
| 7,163,956 B2 | 1/2007 | Wilson et al. |
| 7,192,642 B2 | 3/2007 | Veedu et al. |
| 7,195,780 B2 | 3/2007 | Dennis et al. |
| 7,201,887 B2 | 4/2007 | Smalley et al. |
| 7,204,970 B2 | 4/2007 | Smalley et al. |
| 7,205,069 B2 | 4/2007 | Smalley et al. |
| 7,211,795 B2 | 5/2007 | Collier et al. |
| 7,215,331 B2 | 5/2007 | Song et al. |
| 7,220,818 B2 | 5/2007 | Stoddart et al. |
| 7,250,148 B2 | 7/2007 | Yang et al. |
| 7,264,876 B2 | 9/2007 | Smalley et al. |
| 7,265,174 B2 | 9/2007 | Carroll et al. |
| 7,273,095 B2 | 9/2007 | Li et al. |
| 7,279,916 B2 | 10/2007 | Suhir |
| 7,338,648 B2 | 3/2008 | Harutyunyan et al. |
| 7,338,915 B1 | 3/2008 | Smalley et al. |
| 7,354,563 B2 | 4/2008 | Smalley et al. |
| 7,357,906 B2 | 4/2008 | Colbert et al. |
| 7,372,510 B2 | 5/2008 | Abileah |
| 7,390,477 B2 | 6/2008 | Smalley et al. |
| 7,390,767 B2 | 6/2008 | Smalley et al. |
| 7,436,393 B2 | 10/2008 | Hong et al. |
| 7,700,869 B2 | 4/2010 | Thomsen et al. |
| 7,700,870 B2 | 4/2010 | Thomsen et al. |
| 8,022,291 B2 | 9/2011 | Thomsen et al. |
| 8,080,141 B2 | 12/2011 | Krasnov |
| 8,236,118 B2 | 8/2012 | Veerasamy |
| 8,445,373 B2 | 5/2013 | Broadway et al. |
| 8,501,531 B2 | 8/2013 | Kub |
| 8,507,797 B2 | 8/2013 | Veerasamy |
| 8,535,553 B2 | 9/2013 | Kong et al. |
| 8,637,118 B2 | 1/2014 | Zenasni |
| 8,647,918 B2 | 2/2014 | Kub |
| 8,685,843 B2 | 4/2014 | Li |
| 8,808,810 B2 | 8/2014 | Veerasamy |
| 8,884,310 B2 | 11/2014 | Seacrist |
| 8,984,909 B2 | 3/2015 | Li et al. |
| 9,029,228 B2 | 5/2015 | Seacrist |
| 2002/0130849 A1 | 9/2002 | Ahn et al. |
| 2006/0258054 A1 | 11/2006 | Pan et al. |
| 2008/0169021 A1 | 7/2008 | Krasnov |
| 2008/0199702 A1 | 8/2008 | Murphy et al. |
| 2008/0238882 A1 | 10/2008 | Sivarajan et al. |
| 2008/0245414 A1 | 10/2008 | Sheng et al. |
| 2008/0308147 A1 | 12/2008 | Lu et al. |
| 2009/0020157 A1 | 1/2009 | Krasnov et al. |
| 2009/0032098 A1 | 2/2009 | Lu |
| 2009/0068471 A1 | 3/2009 | Choi et al. |
| 2009/0071533 A1 | 3/2009 | Choi et al. |
| 2009/0085894 A1 | 4/2009 | Gandhi et al. |
| 2009/0110627 A1 | 4/2009 | Choi et al. |
| 2009/0123654 A1 | 5/2009 | Petrmichl et al. |
| 2009/0140801 A1 | 6/2009 | Ozyilmaz et al. |
| 2009/0146111 A1 | 6/2009 | Shin et al. |
| 2009/0155561 A1 | 6/2009 | Choi et al. |
| 2009/0174435 A1 | 7/2009 | Stan et al. |
| 2009/0183816 A1 | 7/2009 | Min et al. |
| 2009/0194157 A1 | 8/2009 | Boer et al. |
| 2009/0305055 A1 | 12/2009 | Shimizu |
| 2009/0324897 A1 | 12/2009 | Choi et al. |
| 2010/0109486 A1 | 5/2010 | Polyakov et al. |
| 2010/0127312 A1 | 5/2010 | Grebel |
| 2010/0187482 A1 | 7/2010 | Mullen et al. |
| 2010/0323164 A1 | 12/2010 | Ogihara et al. |
| 2011/0033688 A1 | 2/2011 | Veerasamy |
| 2011/0070146 A1 | 3/2011 | Song et al. |
| 2011/0104442 A1 | 5/2011 | Yoon et al. |
| 2011/0108521 A1 | 5/2011 | Woo et al. |
| 2011/0198313 A1 | 8/2011 | Baraton et al. |
| 2011/0265918 A1 | 11/2011 | Fujita et al. |
| 2012/0258587 A1 | 10/2012 | Kub |
| 2012/0304696 A1 | 12/2012 | Miller et al. |
| 2013/0001515 A1 | 1/2013 | Li |
| 2013/0074445 A1 | 3/2013 | Jones |
| 2013/0099195 A1 | 4/2013 | Seacrist |
| 2013/0136875 A1 | 5/2013 | Veerasamy |
| 2013/0153550 A1 | 6/2013 | Dear |
| 2013/0153551 A1 | 6/2013 | Dear |
| 2013/0186860 A1 | 7/2013 | Kub |
| 2013/0189444 A1 | 7/2013 | Kub |
| 2013/0240830 A1 | 9/2013 | Seacrist |
| 2013/0292000 A1 | 11/2013 | Dennis et al. |
| 2013/0302542 A1 | 11/2013 | Jones |
| 2013/0305785 A1 | 11/2013 | Dennis et al. |
| 2013/0306222 A1 | 11/2013 | Dennis et al. |
| 2013/0309425 A1 | 11/2013 | Dennis et al. |
| 2014/0034218 A1 | 2/2014 | Hogan et al. |
| 2014/0037869 A1 | 2/2014 | Petrmichl et al. |
| 2014/0037870 A1 | 2/2014 | Petrmichl et al. |
| 2014/0087099 A1 | 3/2014 | Veerasamy et al. |
| 2014/0120270 A1 | 5/2014 | Tour |
| 2014/0261998 A1 | 9/2014 | Veerasamy |
| 2014/0308523 A1 | 10/2014 | Veerasamy |
| 2014/0374960 A1 | 12/2014 | Cojocaru |
| 2015/0121837 A1 | 5/2015 | Kinloch |
| 2015/0144881 A1 | 5/2015 | Seacrist |
| 2015/0300077 A1 | 10/2015 | Veerasamy et al. |
| 2015/0337458 A1 | 11/2015 | Duan |

FOREIGN PATENT DOCUMENTS

| | | |
|---|---|---|
| CN | 101299443 A | 11/2008 |
| CN | 101423109 A | 5/2009 |
| CN | 101423109 A | 5/2009 |
| CN | 101462717 | 6/2009 |
| CN | 102549202 A | 7/2012 |
| DE | 2951330 | 7/1981 |
| DE | 10 2007 029 031 | 12/2008 |
| EP | 0047725 | 12/1985 |
| EP | 0 237 662 | 9/1987 |
| EP | 0489042 | 6/1992 |
| EP | 0645516 | 3/1995 |
| EP | 0812696 | 12/1997 |
| EP | 0831073 | 3/1998 |
| EP | 0854839 | 7/1998 |
| EP | 0831073 | 10/1999 |
| EP | 1015384 | 7/2000 |
| EP | 1115655 | 7/2001 |
| EP | 1404908 | 4/2004 |
| EP | 1623437 | 2/2006 |
| EP | 2 327 662 | 1/2011 |
| EP | 2 281 779 | 2/2011 |
| EP | 2 327 662 | 6/2011 |
| EP | 2 682 366 | 1/2014 |
| EP | 2 716 855 | 4/2014 |
| EP | 2 719 672 | 4/2014 |
| FR | 2 482 161 | 11/1981 |
| FR | 2 752 012 | 6/1998 |
| JP | 10-178195 | 6/1998 |
| JP | 2001-520615 | 10/2001 |
| JP | 2005-520021 | 7/2005 |
| JP | 2006-272491 | 10/2006 |
| JP | 2006-334787 | 12/2006 |
| JP | 2008-529205 | 7/2008 |
| JP | 2008-205272 | 9/2008 |
| JP | 2009-038064 | 2/2009 |
| JP | 2009-107921 | 5/2009 |
| JP | 2009-143799 | 7/2009 |
| JP | 2011-006265 | 1/2011 |

(56) References Cited

FOREIGN PATENT DOCUMENTS

| | | |
|---|---|---|
| JP | 2011-105590 | 6/2011 |
| JP | 2011-157241 | 8/2011 |
| JP | 2011-178644 | 9/2011 |
| KR | 1020010080933 | 8/2001 |
| KR | 10-2005-0102854 | 10/2005 |
| KR | 1020050102854 | 10/2005 |
| KR | 10-2009-0028007 | 3/2009 |
| KR | 1020090028007 | 3/2009 |
| KR | 10-2009-0059871 | 6/2009 |
| KR | 10-2009-0065206 | 6/2009 |
| KR | 1020090065206 | 6/2009 |
| RU | 2 292 409 | 1/2007 |
| RU | 2 295 409 | 1/2007 |
| RU | 2 353 961 | 4/2009 |
| TW | 200901016 | 2/1997 |
| TW | 200901016 A | 2/1997 |
| TW | 471183 | 1/2002 |
| WO | WO 97/00335 | 1/1997 |
| WO | 97/09272 | 3/1997 |
| WO | WO 97/09272 | 3/1997 |
| WO | 98/39250 | 9/1998 |
| WO | WO 98/39250 | 9/1998 |
| WO | 99/49525 | 9/1999 |
| WO | WO 99/47466 | 9/1999 |
| WO | WO 99/49525 | 9/1999 |
| WO | 00/17102 | 3/2000 |
| WO | WO 00/17102 | 3/2000 |
| WO | 02/075438 | 9/2002 |
| WO | 03/004741 | 1/2003 |
| WO | WO 03/004741 | 1/2003 |
| WO | 03/078317 | 9/2003 |
| WO | WO 03/078317 | 9/2003 |
| WO | 2004/097853 | 11/2004 |
| WO | WO 2004/097853 | 11/2004 |
| WO | 2005/084172 | 9/2005 |
| WO | WO 2013/017345 | 2/2007 |
| WO | WO 2008/056126 | 5/2008 |
| WO | 2008/108383 | 9/2008 |
| WO | 2008/112639 | 9/2008 |
| WO | WO 2008/108383 | 9/2008 |
| WO | WO 2008/112639 | 9/2008 |
| WO | 2008/124507 | 10/2008 |
| WO | 2008/128726 | 10/2008 |
| WO | WO 2008/128726 | 10/2008 |
| WO | 2009/049375 | 4/2009 |
| WO | WO 2009/049375 | 4/2009 |
| WO | 2009/085224 | 7/2009 |
| WO | 2009/094277 | 7/2009 |
| WO | WO 2009/085224 | 7/2009 |
| WO | WO 2009/094277 | 7/2009 |
| WO | WO 2011/063704 | 6/2011 |
| WO | WO 2012/058938 | 5/2012 |
| WO | WO 2012/170566 | 12/2012 |
| WO | 2013/113706 | 8/2013 |
| WO | WO 2012/153803 | 7/2014 |
| WO | WO 2012/169530 | 2/2015 |

OTHER PUBLICATIONS

Product Data Sheet for NC-SMQ®80 Solder Paste, Indium Corporation of America (2 pp.).
Brochure for "Research Solder Kits," Indium Corporation of America (6 pp.) at least as early as Dec. 31, 2013.
Griffiths et al., "Fabrication of Evacuated Glazing at Low Temperature," Solar Energy, vol. 63, pp. 243-249 (7 pp.).
PCT International Search Report issued in Application No. PCT/US/00/40300, dated Oct. 27, 2000 (4 pp.).
"Thermal Outgassing of Vacuum Glazing," by Lenzen, et al., School of Physics, Univ. of Sydney, NSW 2006 Australia (31 pp.).
"Temperature-Induced Stresses in Vacuum Glazing: Modelling and Experimental Validation" by Simko et al., Solar Energy, vol. 63, No. 1, pp. 1-21, 1998 (21 pp.).
"Current Status of the Science and Technology of Vacuum Glazing," by Collins, et al., Solar Energy, vol. 62, No. 3, pp. 189-213, 1998 (26 pp.).
Brochure for "Specialty Solders and Alloys, Technical Information" for Indium Corporation of America (6 pp). at least as early as Dec. 31, 2013.
International Search Report for PCT/US2014/071875 dated Apr. 15, 2015, 4 pages.
Veerasamy et al., "Nitrogen Doping of Highly Tetrahedral Amorphous Carbon," Physical Journal Review B, The American Physical Society; vol. 28, No. 4, 1993, pp. 17 954-17 959.
Veerasamy et al., "N-Type Doping of Highly Tetrahedral Diamond-Like Amorphous Carbon," Journal of Condens. Matter, vol. 5, 1993, pp. L169-L174.
Veerasamy et al., "Properties of n-Type Tetrahedral Amorphous Carbon (ta-C)/p-Type Crystalline Silicon Heterojunction Diodes," IEEE Transactions on Electron Devices; vol. 42, No. 4, 1995, pp. 577-585.
"Transparent and Flexible Carbon Nanotube/Polyaniline pH Sensors", Kaempgen et al., Journal of Electroanalytical Chemistry 586 (2006), pp. 72-76.
"High-Conductivity Polymer Nanocomposites Obtained by Tailoring the Characteristics of Carbon Nanotube Fillers", Grossiord et al., Advanced Functional Materials (2008), pp. 3226-3234.
"Applications of Carbon Nanotubes in the Twenty-First Century" Endo et al., The Royal Society (2004), pp. 2223-2238.
"How do Carbon Nanotubes Fit into the Semiconductor Roadmap", Graham et al., Applied Physics A (2005), pp. 1141-1151.
"A Method of Printing Carbon Nanotube Thin Films", Zhou et al., 2006 American Institute of Physics, 3 pages.
"Carbon Nanotube Films for Transparent and Plastic Electronics", Gruner, Journal of Materials Chemistry (2006), pp. 3533-3539.
"Large Area, Few-Layer Graphene Films on Arbitrary Substrates by Chemical Vapor Deposition", Reina et al., 2009 American Chemical Society, Nano Letters 2009, vol. 9, No. 1, pp. 30-35.
"Large-Scale Pattern Growth of Graphene Films for Stretchable Transparent Electrodes", Kim et al., Nature Publishing Group, vol. 457, No. 7230, pp. 706-710.
"Large-Area Synthesis of High-Quality and Uniform Graphene Films on Copper Foils", Li et al., Science American Assoc. for the Advancement of Science, USA, vol. 324, No. 5932, pp. 1312-1314.
"Transferring and Identification of Single- and Few-Layer Graphene on Arbitrary Substrates", Reina et al., Journal of Physical Chemistry Part C: Nanomaterials and Interfaces, American Chemical Society, vol. 112, No. 46, pp. 17741-17744.
"Graphene Segregated on Ni Surfaces and Transferred to Insulators", Yu et al., Applied Physics Letters, American Institute of Physics, vol. 93, No. 11, pp. 113103-1-113103-3.
"Optimizing the Growth Conditions of Large-Scale Graphene Films", XP-002604905, 5 pages. www.nature.com/nature.
"Synthesis of Large-Area Graphene Layers on Poly-Nickel Substrate by Chemical Vapor Deposition: Wrinkle Formation", Chae et al., Advanced Materials, Wiley VCH Velag; vol. 21, No. 22, Jun. 12, 2009, pp. 2328-2333.
"Synthesis of Graphene on Silicon Carbide Substrates at Low Temperature", Juang et al., Carbon 47 (2009) pp. 2026-2031.
"The Role of Hydrogen in the Growth of Amorphous Hydrogenated Carbon", Revelle et al., Solid State Communications, vol. 86, No. 4, pp. 235-237.
"Graphane: A Two-Dimensional Hydrocarbon", Sofo et al., 2007 The American Physical Society, pp. 153401-1/153401-4.
"Control of Graphene's Properties by Reversible Hydrogenation: Evidence of Graphane", Elias et al., Science, vol. 323, Jan. 30, 2009, pp. 610-613 and Supplementary Online Material, pp. 1-S/12-S.
Erik Jonas Järvholm, "Mechanisms and Development of Etch Resistance for Highly Aromatic Monomolecular Etch Masks—Towards Molecular Lithography," Ph.D. Dissertation at the Georgia Institute of Technology, May 2007, 136 pages.
Yanyu Liang et al., "Transparent, Highly Conductive Graphene Electrodes from Acetylene-Assisted Thermolysis of Graphite Oxide Sheets and Nanograph Molecules," Nanotechnology, vol. 20: 434007, Received May 2009, Published Oct. 2009, 7 pages.
KR Office Action dated Feb. 22, 2016 for KR Application No. 10-2012-7002051, 9 pages.

(56) References Cited

OTHER PUBLICATIONS

CN Office Action dated Jun. 5, 2015 for CN Application No. 201080035069.8, 9 pages.
"Transparent Carbon Films as Electrodes in Organic Solar Cells"; Wang et al., Angew. Chem., vol. 120, Issue 16, 20080407 (3pgs).
"Modification of Graphene Properties due to Electron-Beam Irradiation", Teweldebrhan et al.; 2009 American Institute of Physics, Applied Physics Letters 94, 13 pages.
"Applications of Carbon Materials in Photovoltaic Solar Cells", Zhu et al., Solar Energy Materials & Solar Cells 93 (2009) 1461-1470.
Taiwan Search Report dated Feb. 11, 2015 for TW Application No. 99124522.
Russian Office Action dated May 26, 2014 for Application No. 2012108641 (translation), 5 pages.
"A Mechanism for Carbon Nanosheet Formation"; Zhu et al., An International Carbon Journal (45) 2007; pp. 2229-2234.
JP Office Action dated Apr. 8, 2014 for JP Application No. 2012-523594, 8 pages.
J.M. Smith, H.C. Van Ness and M.M. Abbott, Introduction to Chemical Engineering Thermodynamics, pp. 150-151 (5th ed. McGraw-Hill 1996).
Other differential equations Newton's Law of Cooling, accessed online at: http://www.ugrad.math.ube.ea/coursedoc/math100/notes/diffeqs/cool.html on Sep. 24, 2014, 7 pages.
Datta, et al., Crystallographic Etching of Few-Layer Graphene, Nano Letters 2008; 8(7): 1912-1915.
Definition of on, accessed on line at< http://www.merriam-webster.com/dictionary/on> on Apr. 19, 2013, 9 pages.
Definition of determine, accessed on line at< http://www.merriam-webster.com/dictionary/determining> on Apr. 20, 2013, 6 pages.
From Graphene to Graphane, Now the Possibilities Are Endless, accessed online at< http://www.sciencedaily.com/releases/2009/07/090731090011.htm> on Apr. 21, 2013, pp. 1-4.
Fitzer, et al., "Recommended Terminology for the Description of Carbon as a Solid," Pure & Appl. Chem. 1995; 67(3): 473-506.
Scientific Background on the Nobel Prize in Physics 2010, The Royal Swedish Academy of Sciences, pp. 1-10 (Oct. 5, 2010, revised Nov. 29, 2010).
Klusek, et al., "Nanoscale studies of the oxidation and hydrogenation of graphite surface," Corrosion Science 2003; 45: 1383-1393.
Oya, et al., "Review Phenomena of Catalytic Graphitization," Journal of Materials Science 1982; 17: 309-322.
Xuesong, et al., "Transfer of Large-Area Graphene Films for High Performance Transparent Conductive Electrodes," American Chemical Society, Nano Letters, vol. xx, No. x, 2009, pp. A-E.
Rondelez et al., "Two Dimensional Films of Discotic Molecules at an Air-Water Interface," J. Physique 43 (1982) pp. 1371-1377.
Rondelez et al., "Liquid Expanded-Liquid Condensed Phase Transition in Langmuir Films of Discotic Molecules," J. Physique 48 (1987) pp. 1225-1234.
J. Billard et al., "Miscibility Studies of Disc-Like Molecules," Pramana 13 (1979) pp. 309-318.
Wang et al., Transparent, Conductive Graphene Electrodes for Dye-Sensitized Solar Cells, Nano Letters, vol. 8 No. 1, pp. 323-327, published on web Dec. 2007.
"Fabrication and Characterization of Few-Layer Graphene", Zhang et al., Carbon 48 (2010) pp. 359-364.
U.S. Appl. No. 12/285,375, filed Oct. 2, 2008, Den Boer et al.
D.Q. McNerny et al., "Direct fabrication of graphene on SiO2 enabled by thin film stress engineering", Scientific Reports vol. 4, No. 5049m pp. 1-9 (2014).
Y.B. Zhang, Y.W. Tan, H.L. Stormer, and P. Kim, "Experimental observation of the quantum hall effect and Berry's phase in graphene", Nature, vol. 438, No. 7065, pp. 201-204 (2005).
T. Ohta, A. Bostwick, T. Seyller, K. Horn, and E. Rotenberg, "Controlling the electronic structure of bilayer graphene", Science, vol. 313, No. 5789, pp. 951-954 (2006).
H. Ueta, M. Saida, C. Nakai, Y. Yamada, M. Sasaki, and S. Yamamoto, "Highly oriented monolayer graphite formation on Pt(1 1 1) by a supersonic methane beam", Surf. Sci., vol. 560, pp. 183-190 (2004).
N. Gall', E. Rut'kov, and A. Tontegode, "Interaction of silver atoms with iridium and with a two-dimensional graphite film on iridium: Adsorption, desorption, and dissolution", Phys. Solid State, vol. 46, No. 2, pp. 371-377 (2004).
G. Kalita et al., "Low temperature growth of graphene film by microwave assisted surface wave plasma CVD for transparent electrode application", RSC Adv., vol. 2, pp. 2815-2820 (2012).
T. Yamada, M. Ishihara, and M. Hasegawa, "Large area coating of graphene at low temperature using a roll-to-roll microwave plasma chemical vapor deposition", Thin Solid Films vol. 532, pp. 89-93 (2013).
D.Y. Usachov et al., "Graphene Morphology on Ni Single-Crystal Surfaces: Experimental and Theoretical Investigation", Bulletin of the Russian Academy of Science: Physics 2009, May 2009, vol. 73, No. 5, pp. 679-682.
Abstract of K. Reichelt, "Heteroepitaxial Growth of High-Vacuum Evaporated Nickel Films", Journal of Crystal Growth, Nov. 1971, 11(2), 1 page.
Kim et al., Nature 2009, 457, 706-709, Supplemental Information, 11 pages.
Jhung et al., KR 904218 B1, Jun. 2009, English Abstract, 3 pages.
Excerpt from KR 904218 B1, Jun. 2009, Figure, 1 page.
"Large and Flat Graphene Flakes Produced by Epoxy Bonding and Reverse Exfoliation of Highly Oriented Pyrolytic Graphite", Huc et al., IOP Publishing, Nanotechnology 19 (2008), pp. 1-6.
Chen et al. "Oxidation Resistance of Graphene-Coated Cu and Cu/Ni Alloy", ACS Nano 2011, 5(2), 1321-1327.
Zhang,Y., et al., "Review of Chemical Vapor Deposition of Graphene and Related Applications," Acc. Cem. Res. 46, pp. 2329-2339, (2013) (11 pp.).
Kang, J., et al., "Graphene Transfer: Key for Applications," Nanoscale 4, pp. 5527-5537, (2012) (11 pp.).
Regan, W., et al., "A Direct Transfer of Layer-Area Graphene," Appl. Phys. Lett. 96, 113102, (2010) (3 pp.).
Pirkle, A., et al., "The Effect of Chemical Residues on the Physical and Electrical Properties of Chemical Vapor Deposited Graphene Transferred to SiO2," Appl. Phys. Lett. 99, 122108 (2011) (3 pp.).
Bae, S., et al., "Roll-to-Roll Production of 30 Inch Graphene Films for Transparent Electrodes," Nat. Nanotechnol, 5, pp. 574-578, (2010) (5 pp.).
Allen, M. J., et al., "Soft Transfer Printing of Chemically Converted Graphene," Adv. Mater, 21, pp. 2098-2102, (2009) (5 pp.).
Suk, J.W., et al., "Transfer of CVD-Grown Monolayer Graphene onto Arbitrary Substrates," ACS Nano 5, pp. 6916-6924, (2011) (9 pp.).
Li, X.S., et al., "Transfer of Large-Area Graphene Films for High-Performance Transparent Conductive Electrodes," Nano Lett. 9, pp. 4359-4363, (2009), (5 pp.).
Kim, C., et al., "Direct Transfer to Graphene without the Removal of a Metal Substrate Using a Liquid Polymer," Scripta Mater 66, pp. 535-537, (2012) (3 pp.).
Ko, P.J., et al., "Simple Method to Transfer Graphene from Metallic Catalytic Substrates to Flexible Surfaces without Chemical Etching," J. Phys. Conf. Ser. 433, 012002, (2013) (9 pp.).
Kim, J., et al., "Layer-Resolved Graphene Transfer Via Engineered Strain Layers," Science 342, pp. 833-836, (2013) (4 pp.).
Wang, D. et al., "Scalable and Direct Growth of Graphene Micro Ribbons on Dielectric Substrates," Sci. Rep. 3, pp. 1348 (2013) (1 pp.).
Ismach, A., et al., "Direct Chemical Vapor Deposition of Graphene on Dielectric Surfaces," Nano Lett. 10, pp. 1542-1548, (2010) (7 pp.).
Van Laake, L., et al., "Suspended Heated Silicon Platform for Rapid Thermal Control of Surface Reactions with Application to Carbon Nanotube Synthesis," Rev. Sci. Instrum. 78, 083901, (2007) (9 pp.).
Robinson, J.A., et al., "Correlating Raman Spectral Signatures with Carrier Mobility in Epitaxial Graphene: A Guide to Achieving High Mobility on the Wafer Scale," Nano Lett. 9, pp. 2873-2876, (2009) (4 pp.).

(56) References Cited

OTHER PUBLICATIONS

Rao, R., et al., "Effects of Layer Stacking on the Combination Raman Modes in Graphene," ACS Nano 5, pp. 1594-1599, (2011) (6 pp.).
Li, D.F., et al., "Thickness and Stacking Geometry Effects on High Frequency Overtone and Combination Raman Modes of Graphene," J. Raman Spectrosc. 44, pp. 86-91, (2013) (6 pp.).
Cong, C.X., et al., "Second-Order Overtone and Combination Raman Modes of Graphene Layers in the Range of 1690-2150 $cm^1$," ACS Nano 5, pp. 1600-1605 (2011) (6 pp.).
Mohiuddin, T.M.G., et al., "Uniaxial Strain in Graphene by Raman Spectroscopy: G Peak Splitting, Grüneisen Parameters, and Sample Orientation," Phys. Rev. B 79, 205433, (2009) (8 pp.).
Yang, R., et al., "Observation of Raman G-Peak Split for Graphene Nanoribbons with Hydrogen-Terminated Zigzag Edges," Nano Lett. 11, 4083-4088, (2011) (6 pp.).
Cardid, J.M., et al., "Effects of Particle Contamination and Substrate Interaction on the Raman Response of Unintentionally Doped Graphene," J. Appl. Phys. 108, 205433, (2010) (6 pp.).
Chae, S.J., et al., "Synthesis of Large-Area Graphene Layers on Poly-Nickel Substrate by Chemical Vapor Deposition: Wrinkle Formation," Adv. Mater. 21, pp. 2328-2333, (2009) (6 pp.).
Baskes, M.I., et al., "Trapping of Hydrogen and Helium at Grain-Boundaries in Nickel—an Atomistic Study," Metall. Trans. A 16, pp. 1625-1631, (1985) (7 pp.).
Trinkaus, H., "On the Modeling of the High-Temperature Embrittlement of Metals Containing Helium," J. Nucl. Mater. 118, pp. 39-49, (1983) (11 pp.).
Freund, L.B., et al., "Thin Film Material: Stress, Defect Formation, and Surface Evolution," (Cambridge University Press, Cambridge, England; New York; 2003) (820 pp.).
Thompson, C. V. et al. "Stress and Grain Growth in Thin Films," J. Mech. Phys. Solids 44, 657-673 (1996) (17 pp.).
Schroeder, H., et al., "Helium and Hydrogen Effects on the Embrittlement of Iron- and Nickel-Based Alloys," J. Nucl. Mater. 179-181, Part 1, 118-124 (1991) (7 pp.).
Ishizaki, T., et al., "The Effect of Hydrogen and Helium on Microvoid Formation in Iron and Nickel," J. Nucl. Mater. 307-311, Part 2, 961-965 (2002) (5 pp.).
Stamm, U., et al., "The Influence of Helium on the High Temperature Mechanical Properties of DIN 1.4914 Martensitic Steel," J. Nucl. Mater. 155-157, Part 2, 1059-1063 (1988) (5 pp.).
Bechtle, S., et al., "Grainboundary Engineering Markedly Reduces Susceptibility to Intergranular Hydrogen Embrittlement in Metallic Materials," Acta Mater. 57, 4148-4157 (2009) (10 pp.).
Mittendorfer, F. et al., "Graphene on Ni(111): Strong Interaction and Weak Adsorption," Phys. Rev. B 84, 201401 (2011) (4 pp.).
Vanin, M. et al, "Graphene on Metals: A Van Der Waals Density Functional Study," Phys. Rev. B 81, 081408 (2010) (4 pp.).
Zhiping, X., et al., "Interface Structure and Mechanics Between Graphene and Metal Substrates: A First-Principles Study," J. Phys.: Condens. Matter 22, 485301 (2010) (6 pp.).
Myers, A. K., et al., "Comparison of Benzene Adsorption on Nickel(111) and Nickel(100)," J. Phys. Chem. 91, 2230-2232 (1987) (3 pp.).
Jarvis, E. A. A., et al., "Exploiting Covalency to Enhance Metal-Oxide and Oxide-Oxide Adhesion at Heterogeneous Interfaces," J. Am. Ceram. Soc. 86, pp. 373-386 (2003) (14 pp.).
Nguyen, T. C., et al., "Semiconducting Electronic Property of Graphene Adsorbed on (0001) Surfaces of SiO2," Phys. Rev. Lett. 106, 106801 (2011) (4 pp.).
Koenig, S. P., et al., "Ultrastrong Adhesion of Graphene Membranes," Nat. Nanotechnol. 6, pp. 543-546 (2011) (4 pp.).
Zacharia, R., et al., "Interlayer Cohesive Energy of Graphite from Thermal Desorption of Polyaromatic Hydrocarbons," Phys. Rev. B 69, 155406, (2004) (7 pp.).
Rydberg, H. et al., "Van Der Waals Density Functional for Layered Structures," Phys. Rev. Lett. 91, 126402, (2003) (4 pp.).

Lu, N. S., et al., "Failure by Simultaneous Grain Growth, Strain Localization, and Interface Debonding in Metal Films on Polymer Substrates," J. Mater. Res. 24, 379-385, (2009) (7 pp.).
Hutchinson, J.W., et al., "Mixed Mode Cracking in Layered Materials," Adv. Appl. Mech. 29, 191 (1992) (1 pp.) (130 pp.).
Nessim, G. D. et al., "Synthesis of Tall Carpets of Vertically Aligned Carbon Nanotubes by In Situ Generation of Water Vapor Through Preheating of Added Oxygen," Carbon 50, 4002-4009, (2012) (8 pp.).
McNerny, D.Q., et al., "Direct Fabrication of Graphene on $SiO_2$ Enabled by Thin Film Stress Engineering," Scientific Reports, May 2014 (9 pp.).
Zhang et al., "Fabrication and Characterization of Few-Layer Graphene"; Carbon 48 (2010) pp. 359-364, vol. 48, No. 2, Feb. 1, 2010.
D. McNerny, et al., "In Situ Stress-Driven Transfer of CVD Grown Graphene from Ni Film to $SiO_2$/Si Substrate", 14 pages.
Z. Yan, et al., "Growth of Bilayer Graphene on Insulating Substrates," 6 pages. www.acsnano.org.
Z. Peng, et al., "Direct Growth of Bilayer Graphene on $SiO_2$ Substrates by Carbon Diffusion through Nickel," vol. 5, No. 10, pp. 8241-8247, 2011 www.acsnano.org.
J. Kwak, et al., "Near Room-Temperatures Synthesis of Transfer-Free Graphene Films," Nature Communications, Jan. 24, 2012, 7 pages.
"Transparent and Flexible Carbon Nanotube/Polyaniline pH Sensors", Kaempgen et al., Journal of Electroanalytical Chemistry 586, Jan. 2006, pp. 72-76.
"High-Conductivity Polymer Nanocomposites Obtained by Tailoring the Characteristics of Carbon Nanotube Fillers", Grossiord et al., Advanced Functional Materials, Oct. 2008, pp. 3226-3234.
Manuscript "Detection of Rain Using Capacitive Field Imaging", Veerasamy, Guardian Industries Corp., pp. 1-18.
"Applications of Carbon Nanotubes in the Twenty-First Century", Endo et al., The Royal Society, Oct. 2004, pp. 2223-2238.
"How do Carbon Nanotubes Fit into the Semiconductor Roadmap", Graham et al., Applied Physics A, Mar. 2005, pp. 1141-1151.
"A Method of Printing Carbon Nanotube Thin Films", Zhou et al., Mar. 2006, American Institute of Physics, pp. 1-3.
"Carbon Nanotube Films for Transparent and Plastic Electronics", Gruner, Journal of Materials Chemistry, Jun. 2006, pp. 3533-3539.
"Large-Area Synthesis of High-Quality and Uniform Graphene Films on Copper Foils", Li et al., Science, Jun. 5, 2009; vol. 324, pp. 1312-1314.
"Synthesis of Large-Area Graphene Layers on Poly-Nickel Substrate by Chemical Vapor Deposition: Wrinkle Formation"; Chae et al., Advanced Materials, 2009, vol. 21, pp. 2328-2333.
"Large Area, Few-Layer Graphene Films on Arbitrary Substrates by Chemical Vapor Deposition"; Reina et al., Nano Letters, 2009, vol. 9, No. 1.
"Large-Scale Pattern Growth of Graphene Films for Stretchable Transparent Electrodes"; Kim et al., Nature, 2009, vol. 457, pp. 706-710.
Control of Graphene's Properties by Reversible Hydrogenation: Evidence for Graphane; Elias et al. Science, Jan. 30, 2009, vol. 323; pp. 610-613.
"Transparent Carbon Films as Electrodes in Organic Solar Cells"; Wang et al., Angew. Chem., vol. 120, Issue 16, Apr. 7, 2008 (3pgs).
Erik Jonas Järvholm, "Mechanisms and Development of Etch Resistance for Highly Aromatic Monomolecular Etch Masks—Towards Molecular Lithography," Ph.D. Dissertation at the Georgia Institute of Technology, May 2007.
Lileta Gherghel et al., "Pyrolysis in the Mesophase: A Chemist's Approach toward Preparing Carbon Nano- and Microparticles," J. Am. Chem. Soc., vol. 124, pp. 13130-13138, Mar. 2002.
Yanyu Liang et al., "Transparent, Highly Conductive Graphene Electrodes from Acetylene-Assisted Thermolysis of Graphite Oxide Sheets and Nanograph Molecules," Nanotechnology, vol. 20: 434007, Received May 2009, Published Oct. 2009.
Novoselov et al., "Electric Field Effect in Atomically Thin Carbon Films," Science, vol. 306, 2004, pp. 666-669.
Obraztsov et al., "Chemical Vapor Deposition of Thin Graphite Films of Nanometer Thickness," Carbon, vol. 45, 2007, pp. 2017-2021.

(56) References Cited

OTHER PUBLICATIONS

Veerasamy et al., "Nitrogen Doping of Highly Tetrahedral Amorphous Carbon," Physical Review B, vol. 48, No. 24, Dec. 1993, pp. 17 954-17 959.

Veerasamy et al., "N-Type Doping of Highly Tetrahedral Diamond-Like Amorphous Carbon," Journal of Physical Condensation Matter, No. 5, 1993, pp. L169-L174.

Veerasamy et al., "Properties of n-Type Tetrahedral Amorphous Carbon (ta-C)/p-Type Crystalline Silicon Heterojunction Diodes," IEEE Transaction on Electron Devices, vol. 42, No. 4, Apr. 1995, pp. 577-585.

"A Mechanism for Carbon Nanosheet Formation", Zhu et al., An International Carbon Journal (45), Jun. 2007; pp. 2229-2234.

"Modification of Graphene Properties due to Electron-Beam Irradiation", Teweldebrhan et al., Jan. 2009, American Institute of Physics, Applied Physics Letters 94, pp. 1-3.

"Applications of Carbon Materials in Photovoltaic Solar Cells", Zhu et al., Solar Energy Materials & Solar Cells 93, Feb. 2009, pp. 1461-1470.

Catalyst film annealed at 500 C only (no implantation)

Catalyst Film He Implanted and annealed at 500 C

TECHNIQUES FOR LOW TEMPERATURE DIRECT GRAPHENE GROWTH ON GLASS

This application claims the benefit of U.S. Application Ser. No. 62/207,132 filed on Aug. 19, 2015, the entire contents of which are hereby incorporated by reference herein.

This application also incorporates by reference the entire contents of each of U.S. Publication No. 2014/0261998; U.S. Publication No. 2011/0033688; and U.S. Pat. No. 8,808,810.

Certain example embodiments of this invention relate to techniques for low temperature direct graphene growth on glass, and/or associated articles/devices. More particularly, certain example embodiments of this invention relate to techniques for growing graphene at the interface between a stress-engineered Ni-inclusive film and a silicon oxide (e.g., $SiO_2$ or other suitable stoichiometry) coated glass substrate at temperatures well below the melting point of soda lime silica glass.

BACKGROUND AND SUMMARY

Indium tin oxide (ITO) and fluorine-doped tin oxide (FTO or SnO:F) coatings are widely used as window electrodes in opto-electronic devices. These transparent conductive oxides (TCOs) have been immensely successful in a variety of applications. Unfortunately, however, the use of ITO and FTO is becoming increasingly problematic for a number of reasons. Such problems include, for example, the fact that there is a limited amount of the element indium available on Earth, the instability of the TCOs in the presence of acids or bases, their susceptibility to ion diffusion from ion conducting layers, their limited transparency in the near infrared region (e.g., the power-rich spectrum that may benefit some photovoltaic devices), high leakage current of FTO devices caused by FTO structure defects, etc. The brittle nature of ITO and its high deposition and/or processing temperature(s) can also limit its applications. In addition, surface asperities in $SnO_2$:F may cause problematic arcing in some applications.

Thus, it will be appreciated that there is a need in the art for smooth and patternable electrode materials with good stability, high transparency, and excellent conductivity.

The search for novel electrode materials with good stability, high transparency, and excellent conductivity is ongoing. One aspect of this search involves identifying viable alternatives to such conventional TCOs. In this regard, the inventor of the instant invention has developed a viable transparent conductive coating (TCC) based on carbon and, more specifically, based on graphene.

The term graphene generally refers to one or more atomic layers of graphite, e.g., with a single graphene layer or SGL being extendible up to n-layers of graphite (e.g., where n can be as high as about 10, preferably about 5). Graphene's recent discovery and isolation (by cleaving crystalline graphite) comes at a time when the trend in electronics is to reduce the dimensions of the circuit elements to the nanometer scale. In this respect, graphene has unexpectedly led to a new world of unique opto-electronic properties, not encountered in standard electronic materials. This emerges from the linear dispersion relation (E vs. k), which gives rise to charge carriers in graphene having a zero rest mass and behaving like relativistic particles. The relativistic-like behavior of delocalized electrons moving around carbon atoms results from their interaction with the periodic potential of graphene's honeycomb lattice and gives rise to new quasi-particles that at low energies (E<1.2 eV) that are accurately described by the (2+1)-dimensional Dirac equation with an effective speed of light $v_F \approx c/300 = 10^6$ ms$^{-1}$. Therefore, the well-established techniques of quantum electrodynamics (QED) (which deals with photons) can be brought to bear in the study of graphene—with a further advantageous aspect being that such effects are amplified in graphene by a factor of 300. For example, the universal coupling constant $\alpha$ is nearly 2 in graphene compared to $\frac{1}{137}$ in vacuum. Moreover, it has been shown that graphene does not have any electronic band gap, which could open the door to novel opto-electronic applications.

Despite being only one-atom thick (at a minimum), graphene is chemically and thermally stable (although graphene may sometimes be surface-oxidized at 300 degrees C.), thereby allowing successfully fabricated graphene-based devices to withstand ambient and potentially harsh conditions. High quality graphene sheets were first made by micro-mechanical cleavage of bulk graphite. The same technique is being fine-tuned to currently provide high-quality graphene crystallites up to 100 µm$^2$ in size. This size is sufficient for most research purposes in the micro-electronics field. Consequently, most techniques developed so far, mainly at universities, have focused more on the microscopic sample, and similarly have focused generally on device preparation and characterization rather than scaling up.

Unlike many current research trends, to realize the full potential of graphene as a possible TCC, large-area deposition of high quality material on substrates (e.g., silicon, glass, or plastic substrates, including coated versions of the same) is essential. To date, chemical vapor deposition (CVD) is seen by some as being the most promising process for the industrially viable large area growth of graphene. The accepted mechanism involves three steps, namely: (i) dissociation of the carbon precursor at high temperature (e.g., greater than 850 degrees C.) onto a polycrystalline metallic catalyst; (ii) carbon dissolution into the catalyst sub-surface; and (iii) graphene precipitation at the surface of the catalyst as the sample cools down.

Unfortunately, however, these techniques involve several drawbacks. First, they involve very high temperatures (e.g., greater than 850 degrees C. and sometimes higher than 950 degrees C.), as graphene quality is generally poor at lower temperatures since an amorphous graphitic carbon phase is always present given that the duration of the process is at least 30 minutes. Second, these techniques currently involve chemical etching of the catalyst for lift-off and transfer of the graphene onto the intended substrate. This process usually creases as well as contaminates the graphene film and, in general, is not scalable. The polycrystalline nature of the thick Ni, as well as its finite surface roughness, produces non-contiguous graphene domains of varying thickness (e.g., varying integer values of single layer graphene). This non-isotropic growth can be problematic for successful transfer and the fabrication of field effect devices based on graphene. Another characteristic of the incumbent process is that the catalyst film is a blanket film. But lift-off of a patterned thin film oftentimes causes the graphene to float and twist, making the transfer impractical.

Thus, it will be appreciated that it would be desirable to provide improved graphene-forming techniques, in terms of both scale and quality.

Certain example embodiments relate to a method of making a coated article including a graphene-inclusive thin film supported by a glass substrate. A layer comprising Si is formed on the substrate. A layer comprising Ni is formed on the layer comprising Si. Stress in the layer comprising Ni is engineered via He ion implantation and annealing. Following the engineering of stress, graphene is grown on both major surfaces of the layer comprising Ni via plasma-related chemical vapor deposition. The layer comprising Ni and the graphene on the major surface of the layer comprising Ni opposite the substrate are mechanically removed, with at least some of the graphene initially formed at the interface of the layer comprising Si and the layer comprising Ni remaining on the substrate on the layer comprising Si following the mechanical removal, in making the graphene-inclusive thin film.

Certain example embodiments relate to a method of making a coated article including a graphene-inclusive thin film supported by a glass substrate. A layer comprising Ni is formed on the substrate. He ions are implanted in the layer comprising Ni. The layer comprising Ni with the He ions implanted therein is heated. The implanting and the heating create a desired stress profile in the layer comprising Ni. Following creation of the desired stress profile in the layer comprising Ni, a hydrocarbon source gas and a separate hydrogen source gas are provided to a remote plasma-assisted chemical vapor deposition apparatus to facilitate graphene growth on major surfaces of the layer comprising Ni opposite the substrate and adjacent the substrate. The layer comprising Ni is delaminated from the substrate. The delamination removes the layer comprising Ni from the substrate together with graphene grown on the major surface of the layer comprising Ni opposite the substrate, while leaving on the substrate graphene grown on the major surface of the layer comprising Ni adjacent the substrate, in making the graphene-inclusive thin film.

Certain example embodiments relate to a method of making a coated article including a graphene-inclusive thin film supported by a glass substrate. A buffer layer is formed on the substrate. A metal catalyst layer is formed on the buffer layer. Stress in the metal catalyst layer is pre-engineered via He ion implantation and thermal annealing. Following the pre-engineering of stress, graphene is grown on both major surfaces of the metal catalyst layer using a remote plasma-assisted chemical vapor deposition apparatus operating in connection with separate hydrocarbon and hydrogen gasses provided at different flow rates and with a temperature of 450-550 degrees C. in no more than 10 minutes. The metal catalyst layer is removed from the substrate. The delamination removes the metal catalyst layer from the substrate together with graphene grown on the major surface of the metal catalyst layer opposite the substrate while leaving on the substrate graphene grown at the interface of the metal catalyst layer and the buffer layer, in making the graphene-inclusive thin film.

Articles made using these methods and products incorporating such articles also are contemplated herein. Windows, photovoltaic devices, displays, etc., are example applications that may benefit from the technology disclosed herein. In general, the techniques disclosed herein may be used anywhere a TCC would be desirable.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION

Figures 1A, 1B:
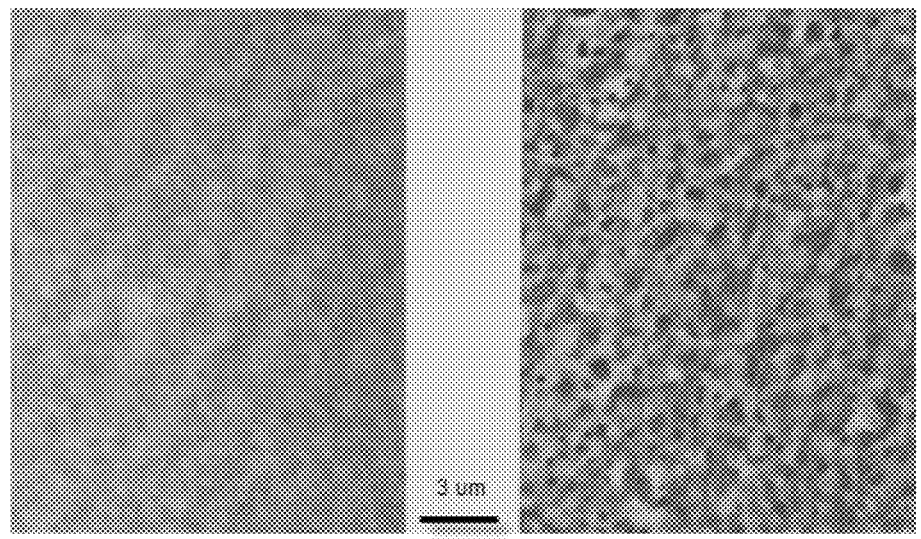
FIG. 1A is an image of a catalyst film annealed at 500 degrees C. without He implantation.
FIG. 1B is an image of a catalyst film annealed at 500 degrees C. with He implanted therein.

Certain example embodiments relate to a remote plasma-assisted chemical vapor deposition (CVD) growth of graphene at the interface between a pre-engineered Ni-inclusive film and silicon oxide (e.g., $SiO_2$ or other suitable stoichiometry) pre-coated glass substrate at temperatures well below the melting point of soda lime silica glass. The stress in the Ni film, which may be e-beam deposited, is engineered via He or other ion implantation and thermal annealing. Interfacial graphene growth takes place faster and at lower temperatures than thermal CVD. Post-growth mechanical delamination of the Ni using adhesive tape resulted in the graphene film being preferentially adherent to silicon oxide (e.g., $SiO_2$ or other suitable stoichiometry) coated glass. Interfacial graphene growth is found to nucleate from arrays of well-aligned domains, and the ensuing films possess sub-nanometer smoothness. Furthermore, it has characteristics such as, for example: excellent crystalline quality, low strain, and few defects. Moreover, it has room-temperature electrical mobility up to $(6.10) \times 10^4$ cm$^2$V, with the graphene displaying above 90% coverage across centimeter scale dimensions, which is limited by the size of the CVD reactor. As will be appreciated by those skilled in the art, these are attractive results, as graphene can be grown at temperatures compatible with soda lime float glass manufacturing processes.

As alluded to above, some current CVD methods of producing graphene use multiple steps that are not easily scalable. For example, some involve high temperatures for both pre-treatment of a catalyst, as well as growth. In 2014, McNerny et al. demonstrated that graphene direct growth on SiO$_2$ coated Si substrates is feasible. See D. Q. McNerny et al., "Direct fabrication of graphene on SiO$_2$ enabled by thin film stress engineering", *Scientific Reports* vol. 4, no. 5049, pp. 1-9 (2014), which is hereby incorporated herein by reference. It was shown that the biaxial stress control of catalyst film and the microstructure evolution upon annealing in helium prior to the graphene growth step is useful in ensuring that the Ni film remains adherent during and after growth. The balance between residual stress and adhesion governs the ability to mechanically remove the Ni after the CVD process. This is an attractive process compared to some transfer methods, which are not readily scalable and are therefore less reliable and hard to reproduce due to mechanical damage and effects of contaminants that tend to compromise the quality of the graphene.

Although this approach is advantageous compared to other known techniques, further improvements are still desirable. For example, in the earlier process, both the pre-treatment and the growth temperatures were high, implying the likelihood of thermally derived strain on the one hand, and revealing topological defects in the film on the other. More so, the high temperature process made difficult the use of ubiquitous transparent substrates such as soda lime float glass, thus substantiating the rationale for the design of an improved engineering process that will address the aforementioned deficiencies—the purview being to enable the manufacturing of a highly uniform interfacial graphene subsequent to a dry, clean, mechanical delamination that can be executed over large and potentially indefinite dimensions.

It is known that a plasma-assisted CVD or plasma-enhanced CVD (PECVD) growth can reduce the substrate temperatures, compared to a straight thermal CVD process. The appropriate plasma provides a rich chemical environment, including an energized mixture of radicals, including molecular and atomic ions from a simple hydrogen-hydrocarbon precursor that allow for lower deposition temperatures and faster growth than thermal CVD. The ability of the plasma to concurrently support multiple reactive species in space and time is an advantage. However, the PECVD-grown graphene to date has not been compatible with soda lime silica glass processing from a temperature perspective and is not significantly better than that of thermal CVD from a quality perspective.

Certain example embodiments relate to techniques for remote plasma-assisted catalytic CVD of graphene films from acetylene and hydrogen as source gasses. Certain example embodiments use Ni, which has a lattice mismatch of 1.1% to graphene. The substrates in this investigation included thin 200 and 300 nm thick Ni films e-beam evaporated onto 100 nm thick silicon oxide (e.g., SiO$_2$ or other suitable stoichiometry) coated glass substrates. The Ni e-beam films were deposited using plasma guns that utilize electrons derived from a plasma. A cold cathode plasma source was used, with the cathode biased negatively from −5 to −20 kV, and with the rest of the source being at ground potential. Following evacuation of the vacuum system to its base pressure, process gas helium was injected into the system. A partial pressure from 1 to 100 mTorr was dynamically maintained using flow controllers at the process gas inlet, and adjustable apertures at the high vacuum stack inlet. Electrons emitted by the cathode ionized process gas atoms, creating positive ions. These ions were in turn accelerated to the cathode and, upon impact, generated a cascade of secondary electrons. Many of these secondary electrons escaped the source and were accelerated and focused on the Ni work piece. The films were then, without breaking vacuum, irradiated with He ions at a voltage of 50 KeV at a fluence range from $10^{16}$ to $10^{17}$ He$^+$/cm$^2$. A closed drift linear ion beam source was used as the implanter. This technique aided in conferring the following advantageous attributes to the catalyst film prior to graphene formation stage:

He bubble-induced pores upon annealing at temperatures as low as 450 C;

Twin boundary formation during the amorphous to polycrystalline phase; and

Presence of dislocations.

Pre-loading the Ni film with implanted He in this way helps avoid the conventional approach of heating the Ni film at around 1,000 degrees C. in inert gas to convert the amorphous films to the polycrystalline phase as well as engineer stress. Control of stress aids in graphene growth at both the surface and interface. With Ni films thinner than about 100 nm, the annealing results in agglomeration of the metal film into particulates with discontinuous layers. Examination of the annealing process shows polycrystalline grains in the about 300 nm thick layers, ranging in size from less than a micron to around 20 μm, as determined with a scanning electron microscope. Annealing in He at atmospheric pressure causes He diffusion and segregation in Ni, leading to a highly porous microstructure conducive for diffusion of C through the catalyst film leading to interfacial graphene layer (IGL) growth.

During the deposition process, it is believed that decomposition of the carbon bearing sources produces carbon atoms that then dissolve into these metals as interstitials forming solid solutions. Upon cooling, the segregation of the carbon atoms leads to the formation of the graphene layer. Transformation of the amorphous phase carbon to its more stable crystalline counterpart generally requires a thermally assisted kinetic process involving nucleation and growth. However, it is known that the crystallization temperatures can be significantly reduced in the presence of some transition metals, notably Ni, due to their catalytic nature, which assists in the transformation process.

FIG. 1A is an image of a catalyst film annealed at 500 degrees C. without He implantation, and FIG. 1B is an image of a catalyst film annealed at 500 degrees C. with He implanted therein.

Certain example embodiments use a Ni catalyst layer that is 50-500 nm thick, more preferably 100-300 nm thick, that has He ion beam implanted therein. Ion beam implantation may be facilitated using an e-beam, and the implantation may be accomplished at room temperature and in vacuum. Annealing may be performed at a temperature range of 400-650 degrees C., more preferably 450-550 degrees C., and the vacuum may be maintained between Ni deposition and ion beam implantation. Vacuum also may be kept during annealing and/or during graphene formation. This in essence helps precondition the Ni and engineer stresses therein that are conducive for allowing (1) graphene to be formed at the lower and upper Ni interfaces, (2) the Ni and upper graphene to be easily removed via a delamination procedure, and (3) the remaining lower graphene to be largely free from stress. In order to adapt the process for use with glass, a silicon-inclusive layer (e.g., silicon oxide, silicon nitride, silicon oxynitride, and/or the like) may be formed directly on and contacting the glass substrate, under the Ni. The bottom layer graphene thus may be formed at the interface of the silicon-inclusive layer and the lower Ni surface. The silicon-inclusive layer may be 10-300 nm thick, more preferably 50-150 nm thick, and possibly about 100 nm thick.

Figure 2:
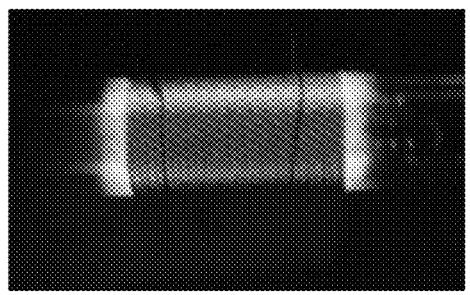
FIGS. 2-3 show an apparatus having a helical antenna and that uses cylindrical inductively coupled plasma (ICP), which may be used in connection with the graphene growth techniques of certain example embodiments.
Figure 3:
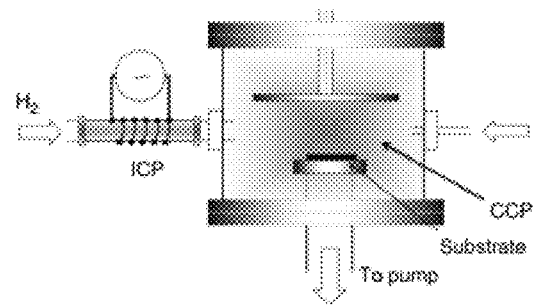

A cylindrical inductively coupled plasma (ICP) having a helical antenna may be used in connection with the graphene growth techniques of certain example embodiments. See FIGS. 2-3 in this regard. The plasma density of ICP is approximately ten times higher than that in a capacitive mode at the same RF power input. RF power is inductively coupled into the process chamber with the helicoidal antenna through a quartz (fused silica) wall of the cylindrical reactor situated upstream from the deposition chamber. When a time-varying electric current is passed through the RF coil antenna located on the quartz window, it creates a time varying magnetic field around it, which in turn induces azimuthal electric current in the gas inside the chamber, leading to the break down and production of high-density plasma. The plasma density of the ICP discharge is on the order of $10^{12}$ cm$^3$. This technique is also used to grow carbon nanotubes aligned perpendicular to the surface. To reduce the electric field orientation dependence with respect to the substrate, an upstream remote plasma was utilized to produce planar graphene films with respect to the substrates.

With the above remote plasma configuration, graphene films were produced on Ni substrates with acetylene and hydrogen at 650 degrees C. in about 5 min growth time. Both the gasses were flowed through the plasma. Typical flow rates of $C_2H_2$ and hydrogen were 30 and 10 sccm, respectively, with a total pressure of 100 mTorr (13.3 Pa). The RF plasma was operated at a frequency of 13.54 MHz and at 250-750 W, yielding a plasma power density of about 40 to 150 W/cm$^2$. Without the plasma, under these conditions, Raman spectroscopy showed no detectable graphene film growth. However, graphene films were produced on these substrates under similar flow conditions at 900 degrees C. via thermal CVD. Although formation of graphene was detected with only $C_2H_2$, the addition of hydrogen produced Raman signals with longer, narrower peaks.

The improvement in the Raman signal in the presence of hydrogen can be explained as a relatively high concentration of atomic hydrogen produced in ICP, which is a contributive factor in the growth of the carbon nanosheets. Atomic H is known to etch amorphous carbon, sp$^2$ and sp$^3$ hybridized carbon at very different rates. Hence, it can selectively etch amorphous carbon defects that can serve as secondary nuclei for competing film growth. By eliminating or minimizing the competing growth, hydrogen promotes growth of higher quality graphene.

Certain example embodiments therefore use a hydrocarbon gas source such as acetylene gas, and additional hydrogen gas that is separate from the hydrocarbon gas source, in forming the graphene using a remote plasma CVD process. Temperatures ranging from 400-650 degrees C., more preferably 450-550 degrees C. may be used in forming the graphene over and under the preconditioned and annealed Ni layer, as discussed above. These temperature ranges are of course compatible with glass substrates.

Following growth, the graphene films were detached from the substrates by tape. Films that were annealed and exposed to hydrocarbons at low pressure remain adhered to the substrate but could be removed cleanly with Scotch tape after cooling by firmly applying the tape to the cooled sample surface and peeling manually. In this case, the Ni delaminated from the IGL in a single, continuous film. Under low pressure conditions (200 mTorr), 5 minutes of He exposure enabled tape delamination after cooling. One should note that the graphene film grows on both the surface and interface; hence, there were two separate layers present in the catalyst film that was delaminated.

Figure 4:
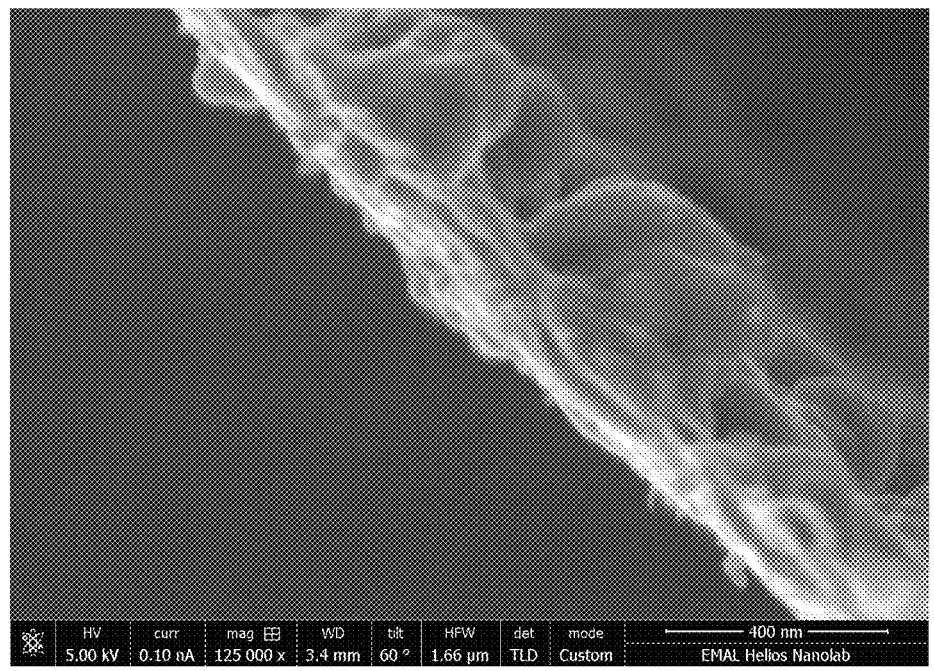
FIG. 4 is an SEM image representing the top and bottom of a Ni film removed via tape after graphene formation in accordance with certain example embodiments.

FIG. 4 is an SEM image representing the top and bottom of the Ni film. The roughness of the Ni film on the top of the delaminated material is observable.

Films that have been implanted with He, annealed, and exposed to hydrocarbons at low pressure remain adhered to the substrate during the growth stage. By applying and pressing Scotch or similar tape to the cooled substrate surface and mechanically peeling, the Ni catalyst film delaminates cleanly from the IGL, leaving a continuous layer of graphene on the substrate. The variation in the graphene film thickness was visually discernable on the 300 nm thick oxide substrate by viewing it at almost grazing angles. It was determined that large area (~3 cm$^2$ films) were not entirely uniform: They were thicker near the middle, probably due to lower temperatures at the outer edges. The thickness variation was confirmed with Raman spectroscopy, which provided a quick measure of the layer thickness and defects.

Figure 5:
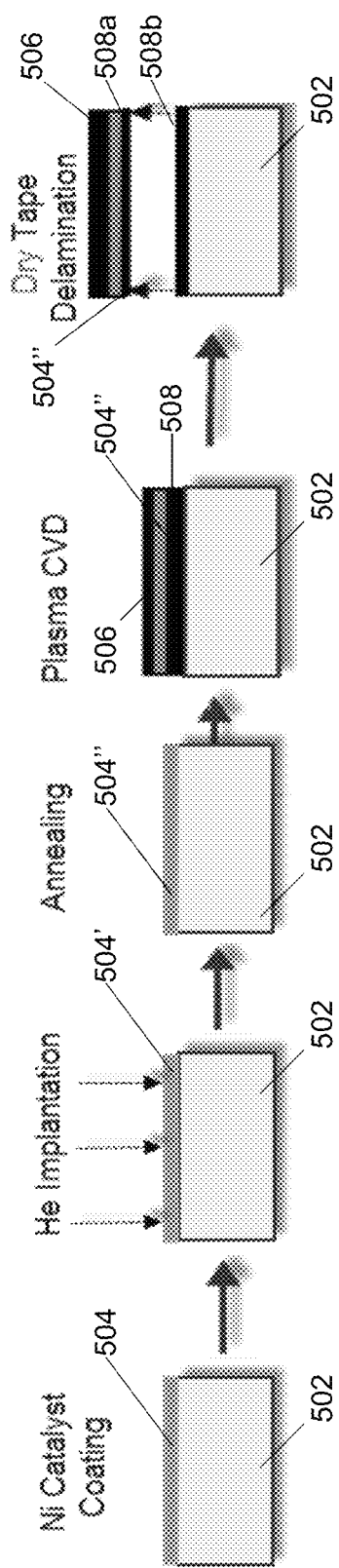
FIG. 5 is a schematic view of an approach for forming a graphene thin film in accordance with certain example embodiments.

FIG. 5 is a schematic view of an approach for forming a graphene thin film in accordance with certain example embodiments. Moving from left-to-right in FIG. 5, a Ni catalyst coating 504 is formed on the substrate 502 (which may be a glass substrate in an annealed or heat treated state). In certain example embodiments, a silicon-inclusive layer (e.g., a layer comprising silicon oxide or the like) may be formed between the glass substrate 502 and the Ni catalyst coating 504. He implantation occurs, resulting in a He-inclusive Ni coating 504'. After annealing, the stress-engineered and preconditioned Ni coating 504" is ready to facilitate graphene growth both over and contacting it, as well as between it and the substrate 502. Thus, first and second graphene growths 506 and 508 are shown over and contacting the stress-engineered and preconditioned Ni coating 504" after a plasma CVD or other deposition technique is used. Dry tape delamination removes the first graphene growth 506, the stress-engineered and preconditioned Ni coating 504", and a first portion of the second graphene growth 508a. A second portion of the second graphene growth 508b remains on the substrate 502 and is of a good quality.

Laboratory-based measurements were carried out with an AXIS Ultra DLD photoelectron spectrometer (Kratos Analytical, U.K.). XPS spectra were recorded at an emission angle of 0 degrees using monochromated Al K$_\alpha$ excitation at pass energies of 80 eV for survey spectra, and 20 eV for high-resolution core level spectra. The source-to-analyzer angle was 60 degrees. The binding energy (BE) scale of the instrument was calibrated following a procedure recommended by the manufacturer, which uses ISO 15472 reference BE data. Spectra were taken by setting the instrument to the hybrid lens mode and the slot mode, providing approximately a 300 µm×700 µm analysis area. The BE scale was calibrated using the C 1s component of aliphatic hydrocarbon at BE=285.0 eV. High-resolution C 1s, Ni 2p, core level spectra were analyzed using Unifit software, version 2010 (Unifit Scientific Software GmbH, Leipzig, Germany).

Depth-profiling including XPS is a powerful way to obtain information about the electronic structure C loaded pure Ni thin film (200 nm). XPS data is useful when there is a firm basis for relating the XPS binding energies, BEs, and BE shifts (ΔBEs), to the physical and chemical aspects of the atomistic interactions within the Ni catalyst material.

Figure 6:
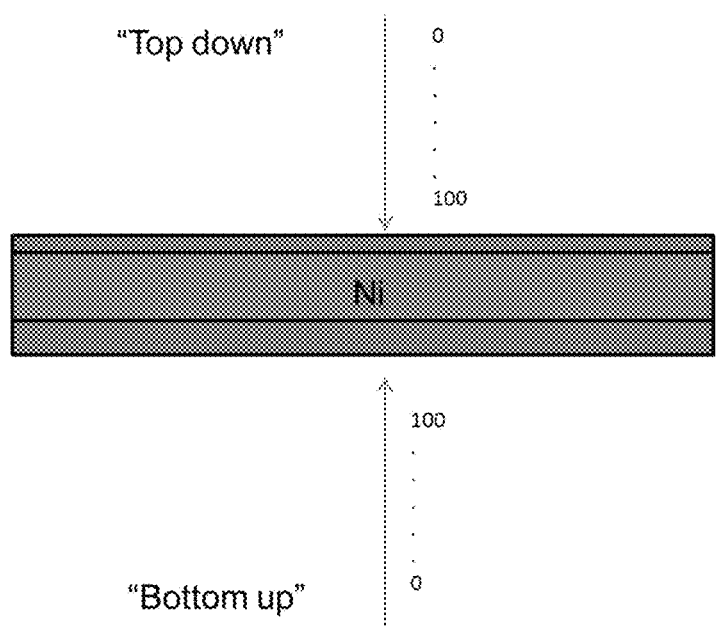
FIG. 6 is a representation of the XPS depth profiling performed on samples made in accordance with certain example embodiments.

FIG. 6 is a representation of the XPS depth profiling performed on samples made in accordance with certain example embodiments. FIG. 6 shows the bottom-up and top-down scan sequences.

For each scan that was fitted, a background correction was performed to create a flat baseline that took into account any satellite peaks present. Then "a la maniere de" Shirley, a Gauss-Lorentzian fit was used to model the peaks. The strongest peak, or the elemental identifier, was fit as well as deconvolution of the shake-up peaks hidden underneath the tail. Additional shake-up peaks were modeled accordingly. The modeled data was then interpreted and graphed in MatLab with robust linear fits.

Literature searches on graphene growth on the surface Ni have proposed that Nickel Carbide may be present in the sub-surface of the catalyst material. The observation of top Ni and C XPS peaks shift as a function of scan depth and initially seems to fit this picture; however, there are two reasons that seem to disfavor this preliminary conclusion. If NiC was indeed present, one would expect a correlation between the C and Ni BE peaks that would span the range between 853.4 down to 852.9 eV for Ni coinciding to 284.5 eV to 281.2 eV for C. Furthermore, the temperature of growth in the process is too high for the NiC phase to be stable. Analysis of the XPS data showed that the BEs of the surface (top) and interfacial (bottom) Ni and C were not similar.

It was proposed that the variation in the Ni $2p^{3/2}$ and Ni $2P^{1/2}$ pointed to lattice distortions, vacancies, grain boundaries (GBs), and/or dislocations. Although the samples were conducting, charging effects may still influence the XPS in a manner that would cause broadening as well as shifting in the peaks. Other factors that were considered in this investigation were whether or not oxygen was present in the form of oxides in the material; however, this was quickly ruled out, as the BE of the Ni and C peaks did not match any oxide species. Photoelectrons interacting or getting scattered by other electrons in the film material are possible and would be observed as an energy loss. These electrons would then lose some kinetic energy due to plasmon interaction, and corresponding shifts in BE may be observed as shake-up peaks. A possible explanation for the observed shift in BE as a function of depth is a core level binding energy shift of both the Ni due to strain in host nanocrystalline Ni film and the graphene that precipitates out of the Ni. A consequence of this hypothesis (shown through modeling) is that the level strain at the interfacial side should be greater than at the surface. This strain difference is accurately measured via Raman spectroscopy of the graphene at these locations.

Researchers in the field have been conducting ab-initio theoretical studies of suitable model systems to provide a way to definitively establish the relationship of specific features of the bonding and environment of the core ionized atom to the ΔBE. These studies are especially important when there is more than one important contribution to ΔBE and, in particular, when the contributions are cancelling. Indeed, this cancellation arises for the example of BE shifts with particle size.

For the analysis of BE shifts, there is broad agreement that the contributions to the ΔBE are divided into two categories: (1) Initial state effects that reflect the potential at the ionized atom due to the electronic charge density (also known as the potential term), and (2) Final state effects that are due to the screening of the core hole by the relaxation of the "passive" or "spectator" electrons (also known as relaxation). The distinction can be useful, as the initial state effects can be directly related to the physics and chemistry of the electronic structure of the system. On the other hand, the screening that is responsible for the final state contributions to the BE and ΔBE describes the electronic structure of the core-hole state (after the core electron is ejected), and this very excited state is not especially relevant for the ground state chemistry. Thus, it can be useful to be able to separate these two effects.

Recently, a combined experimental and theoretical study showed that the contribution of initial and final state effects to the BE shifts are of comparable magnitude. The dominant origin of the initial state effect was identified as being a significant reduction in the metal-metal distances in small grains compared to those in the bulk. This is described as a lattice strain. High resolution TEM (HRTEM) images of the Ni loaded with C made in accordance with certain example embodiments clearly show the presence of graphitic inclusion between the grains of Ni. These inclusions are distributed within the bulk of the Ni catalyst. Furthermore, experimental validation that these grains are under compressive stress due to inclusion of C interstitials in the Ni lattice has been confirmed in these films. Thus, an increase in the core-level BEs can be expected due to an increased involvement of the highest d shell electrons in the chemical bonding when the Ni—Ni interatomic bond distance r is reduced, i.e., due to increased d-hybridization.

Figure 7:
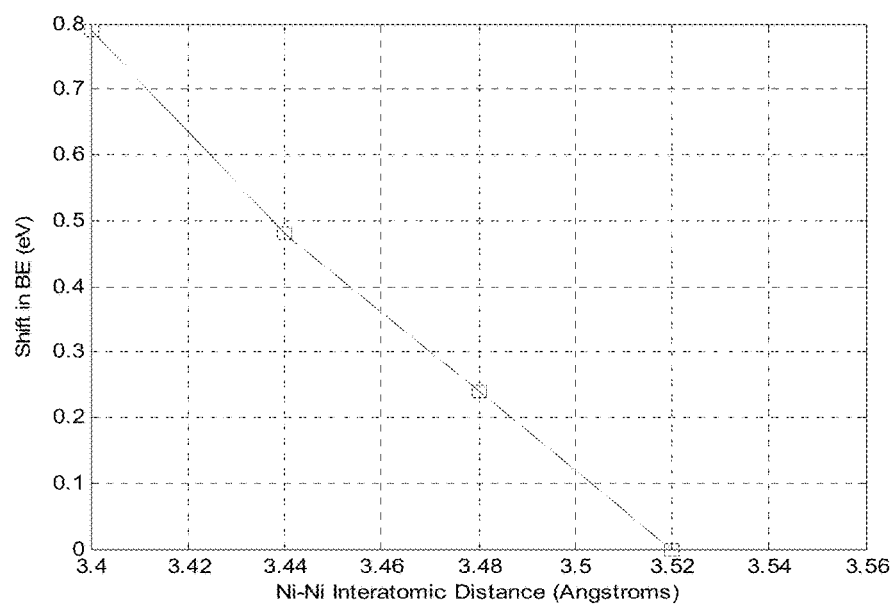
FIG. 7 a graph simulating the shift in core binding energies of Ni as a function of compressive strain.
Figure 8:
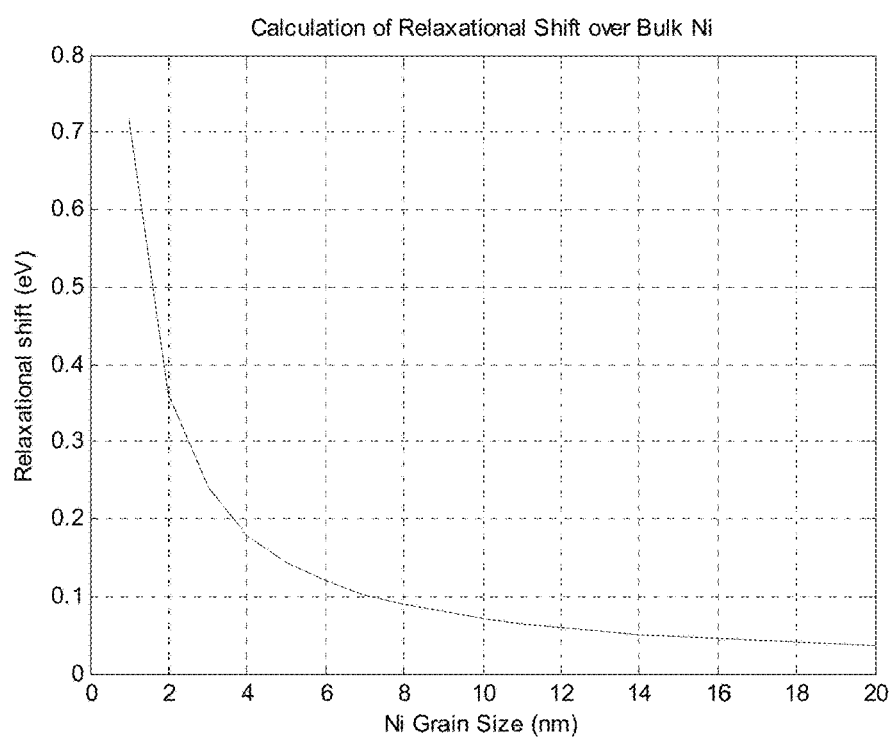
FIG. 8 is a representation of the calculation of relaxation shift over bulk Ni.

FIG. 7 is a graph simulating the shift in core binding energies of Ni as a function of compressive strain. As shown in FIG. 6, the shift in BE decreases as the Ni—Ni interatomic distance increases. The reduction appears to be nearly linear in FIG. 7. FIG. 8 is a representation of the calculation of relaxation shift over bulk Ni.

Using the Koopman Method, the ΔBE contribution from initial state effects due to lattice strain was calculated. The ΔBE due to lattice strain does represent an initial state effect, and the study was directed to analysis of the ΔBE(Strain). The sum of ΔBE and the individual contributions are nearly linear in r(NN) consistent with Koopman. The larger d-hybridization and participation in the chemical bonding for reduced r leads to an increase in the BEs. This follows from the fact that the 3d charge is much more compact than the conduction band charge, and hybridization leads to a smaller repulsive potential for the core level ions, and hence a larger BE. The potential wells formed by the core are deeper. On the other hand, the "environmental charge", 4sp-only, contribution to ΔBE leads to a lower BE as r is reduced. This is to be expected, since a smaller r leads to a larger charge density about the core-ionized atom, and this lowers the BE. However, the hybridization of the 3d orbital, which contributes to the chemical bonding between the Ni atoms, leads to changes in the ΔBE that are, for all the nearest neighbor distances, about twice as large as the changes in ΔBE due to the environmental charge density. The electrostatic origin of these contributions is discussed in detail for condensed systems.

In order to further corroborate these findings, it would be useful to also plot both the BE and BE FWHM (of the peaks)

as a function of depth in both the "top" and "bottom" samples. Because the compressive stress is graded (from top-down) in the film depth and a grain size distribution exists, one would expect the variance in ΔBE to increase in depth. In other words, the surface of the Ni would show less variance than the interface. These results would then be inverted in the samples. If this explanation is correct, then the high resolution spectrum of an untreated Ni film should display core binding energies of the Ni $2p^{3/2}$ closer to Ni bulk crystal. In fact, these trends seem to be more evident in the $2p^1$ spectra, but much more careful validation could be useful.

The following table provides a summary of expected binding energies in various Ni and C electronic states.

| Nickel State | Binding Energy Ni $2p^{3/2}$ [eV] | Carbon State | Binding Energy [eV] |
| --- | --- | --- | --- |
| Ni ($2p^{3/2}$) | 852.7-853.4 | C (sp2) | 284.5 |
| NiO | 854.1 | C (sp3) | 285.8 |
| $Ni_2O_3$ | 854.2 | $NiC_x$ | 281.2 |
| NiC | 852.9 | $Ni_3C$ | 283.9 |
| $Ni(OH)_4$ | 855.4 | C—O | 288-290 |
| $Ni(CO)_4$ | 854.8-855 | $Ni(CO)_4$ | 288.2-288.4 |

Without wishing to be bound by theory (unless expressly claimed), the growth model that is proposed for graphene growth at the Ni/substrate interface (or interface of the Ni/Si) is as follows. It involves sorption of a hydrocarbon gas at the hot Ni surface followed by diffusion of C through the Ni film. As the temperature rises, contribution to the biaxial compressive stress in the Ni thin film arises from the thermal expansion mismatch with the substrate and increased diffusion/precipitation of C within the Ni bulk. The catalyst undergoes a phase change to a more crystalline and textured state, which in turn increases the diffusion rate of C via grain boundaries. The compressive stress state of the Ni continues as long as it is bonded to the substrate during the temperature increase and loading with C. As C diffuses to the interface, minimization of the interfacial energy under the stressed Ni/substrate (or Ni/Si) causes C to segregate out as graphene sheets. As the continuous graphene layers segregate out, the process sequentially causes the stress in the Ni interface (bottom) to be released in a periodic manner as one interface gives way to two interfaces. The imprint of these stress-strain oscillations or periods in the Ni grains at the interface therefore may be "seen" as the Ni film decouples from the substrate.

The growth sequence of graphene at both surfaces (top and bottom) is described and observed in the following manner. As the hydrocarbon gas comes into contact with the hot catalyst, graphene formation on the top Ni substrate is extremely fast (on the order of seconds) compared to the interfacial graphene. The heating of the Ni causes a preferential texturing in the (111) orientation. Carbon diffusion via the grain boundaries is also rapid and floods the Ni to form a super-saturated C solution in Ni. This takes place within 10 seconds and results in C exiting the Ni lattice and accumulating at the interface as graphene islands. Compressive stress that builds up within the Ni at the interface is relieved by the stitching of the nano-graphene islands into a contiguous and continuous graphene sheet. This process repeats itself as C periodically segregates out of the Ni. Because the Ni catalyst is in compression, the graphene at the interface is under a tensile stress. So the stress at the interface should oscillate between these two extremes.

Figure 9:
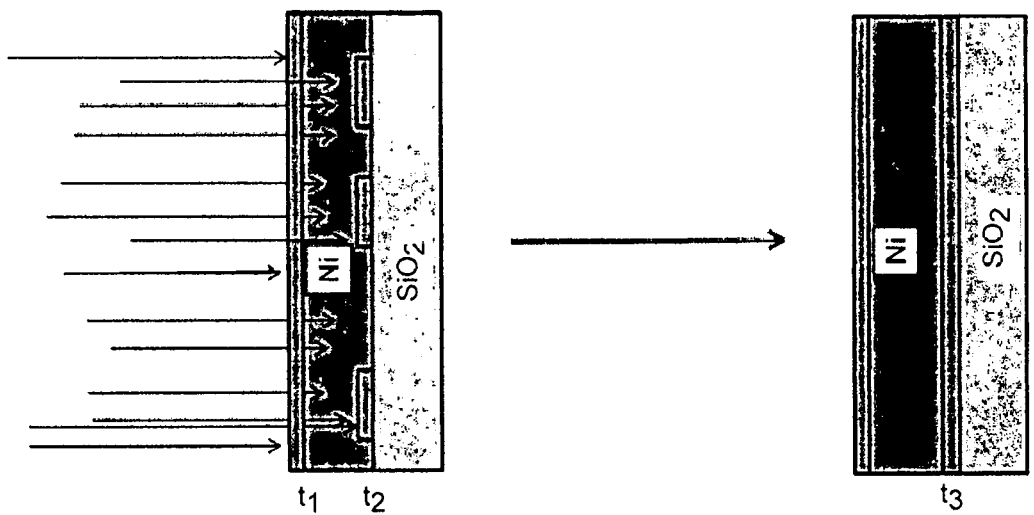
FIG. 9 is a schematic view of the growth mechanism of graphene on the surface of the Ni and at the Ni/Si interface, which may be present in certain example embodiments.
Figure 10:
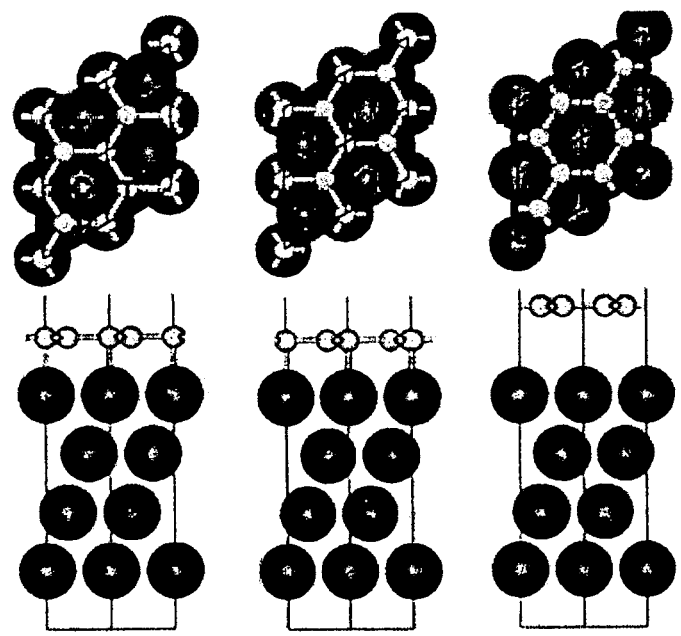
FIG. 10 is a representation of the change in Ni (dark spheres) as the C (yellow spheres) move through the lattice as it is deposited between the Ni/Si interface, which may take place in connection with certain example embodiments.

FIG. 9 is a schematic view of the growth mechanism of graphene on the surface of the Ni and at the Ni/Si interface, which may be present in certain example embodiments. FIG. 10 is a representation of the change in Ni (dark spheres) as the C (yellow spheres) move through the lattice as it is deposited between the Ni/Si interface, which may take place in connection with certain example embodiments. FIGS. 9-10 thus schematically illustrate the mechanism described above (e.g., in the prior to paragraph).

Analysis of the shake-up peaks was performed to understand whether there is an electronic contribution that could be observed in the shake-up peaks of the C and Ni. Energy calculations show the following regarding the energy loss in graphene. This work was performed at Centre national de la recherché scientifique (CNRS) where the energy loss and band structure using DFT calculations were done. As shown by the simulation of graphene, it is expected there are three energy loss mechanisms. These occur at approximately 2.1 eV, 4-5 eV, and 5.7 eV.

The following is used to explain the theoretical calculations as discussed above as it relates to the observed experimental data. Pauli's exclusion principle states that the σ and π orbitals of the nucleus are occupied and high energy orbitals σ* and π* orbitals remain vacant with the π and π* orbitals hybridized. The electrons in these orbitals are delocalized and thus have a high mean free path, especially when compared to the localized σ electrons. As incident x-ray radiation interacts with the 1s electron of C, enough kinetic energy is present to overcome the pull of the electrostatic nature of the nucleus. This electron is ejected and interacts most strongly with the delocalized it electrons. This interaction occurs at lower energies (2.1 eV) with three collective oscillations. The electromagnetic field of the ejected electron interacts strongly with the pi cloud. This explains the presence of multiple shake-up peaks and their value via the coupling interaction of the photoelectron, with the pi band giving rise to plasmon at the Q=0.41 which is equivalent to the reciprocal of the base vector magnitude in graphene (√3 $a_o$). Q will be modulated by the strain in the pi band. These interactions produce collective oscillation within the pi cloud, which is observed more strongly in the bottom graphene layer over the top graphene layer. This observation is made in the ΔeV between each of the shake-up satellites and the 1s BE. At the $5^{th}$ shake-up peak, this model is no longer valid, as it predicts there are only three shake-up peaks interacting with the hybridized it orbitals. Therefore, there are three inelastic or "ringing" interactions the electron has with the π orbitals and results in a higher BE caused by a decrease in the KE afforded to these electrons.

The differences in binding energy between the Ni $2p^{3/2}$ peak and the shake-up satellites were also studied. There are three shake-up peaks that could be fitted in this particular study, although it appears that only two shake-up peaks are of relevance. There are two main satellite intensities with BE near 3.7 eV and 6.0 eV that one should observe for Ni $2p^{3/2}$. In this study, the top and bottom of the Ni film was scanned, and the ΔeV between the Ni $2p^{3/2}$ peak and the satellites were studied.

It is interesting to note that there are differences observed between the Ni top and Ni bottom energy differences. Considering the Ni, Ni $2p^{3/2}$ bottom eV first, there are three changes in eV observed at ~2 ΔeV, ~5.7 ΔeV, and ~8.0 ΔeV. A cursory analysis of these differences in energy from the Ni $2p^{3/2}$ peak suggests that there might be several different processes occurring at the Ni bottom surface. The loss of KE from inelastic collisions of those electrons in the ~5.7 eV range might be caused by the surface plasmon, and the weaker peak at ~8.0 eV may be attributed to multiple loss interactions of a Ni 3d to a Ni 4s transition and surface plasmon interaction. This lower energy at ~8.0 eV might be an interaction between the Ni and graphene. The ~2 eV difference between the shake-up and Ni $2p^{3/2}$ peak can be attributed to a loss mechanism with the graphitic inclusion throughout the Ni. However, it may be caused by additional Columobic attractions due to generated core/hole states in the atom. Another possible explanation for this behavior is the additional stresses that occurs. As graphene is formed and excreted through the Ni film, the Ni film may have additional defects such as dislocations that contribute to this higher ΔeV.

The Ni $2p^{3/2}$ peak for the top Ni film appears to be similar; however, there are different origins for these shake-up peaks. The energy loss at ΔeV of ~4.0 eV and ~6.0 eV suggests that these loss processes are inter-band transitions or surface plasmons. The ΔeV of ~2.0 eV cannot be ascribed to a particular loss mechanism.

Figure 11A:
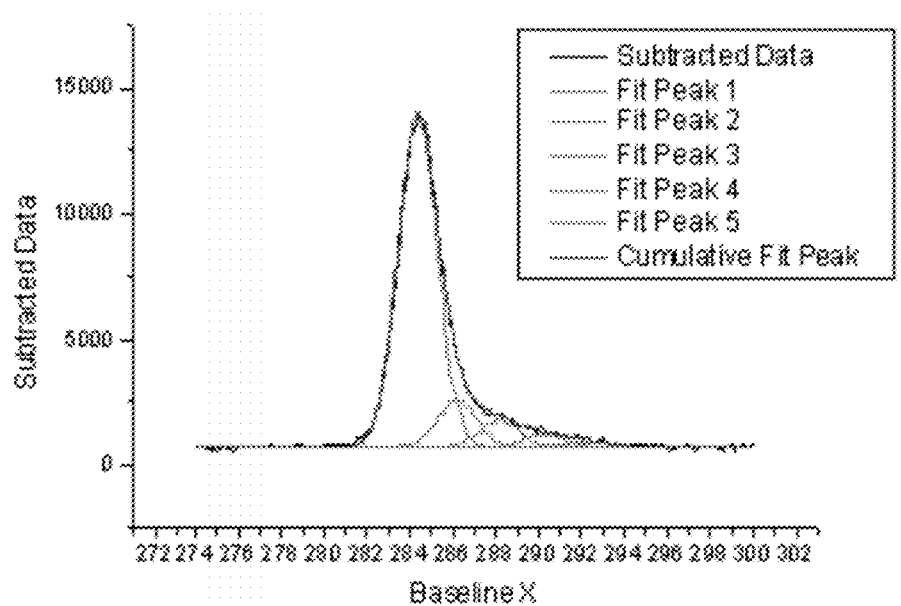
FIG. 11A is a graph plotting experimental data for the C 1s peak.
Figure 11B:
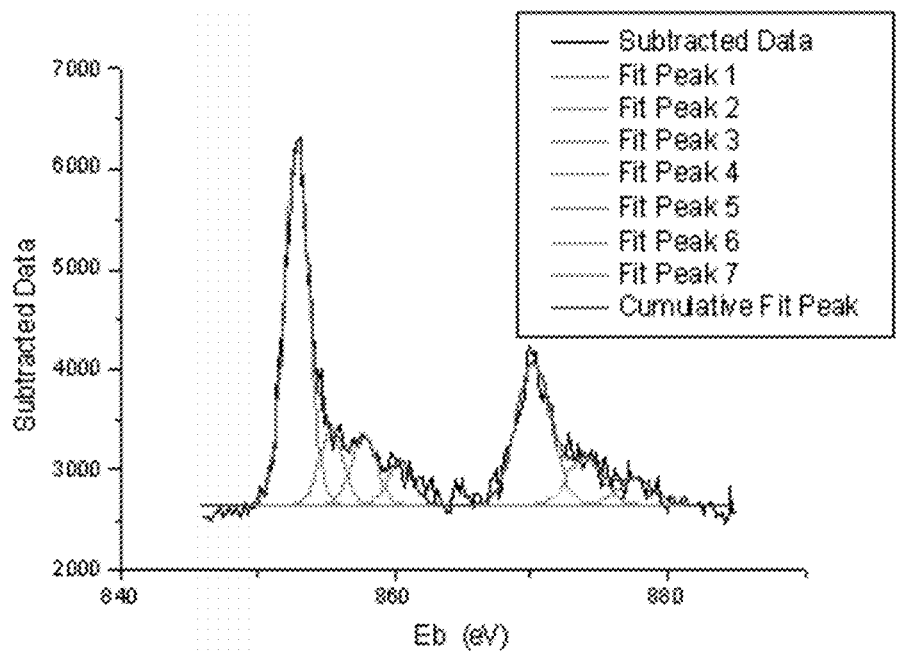
FIG. 11B is a graph plotting experimental data for the Ni 2p peak.

The FIG. 11A graph represents the C 1s peak, and the FIG. 11B graph represents the Ni 2p peak. The black line represents the subtracted data. The individual peaks are represented by green lines. The cumulative fit is represented by the red line. The black and red lines basically overlap in these graphs.

Based on computational methods, stress levels observed in the 1.2-2 GPa regime should be observed experimentally in high resolution XPS of both the Ni and C. This stress/strain relationship should be observed via core binding energy shifts. By plotting and stitching together the core level binding energies for both C and Ni, this relationship is easily observed. By performing the simple transformation of the depth Sb (scan bottom)=100−scan number and St (scan top)=scan #−100, graphs such as those presented in FIG. 12A-14 can be generated. There are some noteworthy features that can be observed. First, there are noticeable differences between the top and bottom for both the Ni and C BEs and its spatial gradient. There is periodicity associated with the C bottom and the appearance of binning of the Ni. This can be explained in the following manner: As the C dissolves, it diffuses through and segregates out at the bottom Ni film where there is a contraction associated with the Ni film, which gives rise to the periodicity associated with the C. The appearance of binning of the Ni film may be caused by differences in surface of the Ni. Because the C segregation process modulates the stress in the Ni film, the bottom surface of the Ni has by the signature of the stress associated with a continuous graphene layer formation. Those layers that are towards the inner bulk of the films do not have these stress signatures, because C is segregated at the grain boundaries instead they are interstitial. This phenomenon is similar to what is observed in the Ni top. Moving from the top through the graphene film, the Ni surface is under some stress and, as the depth profile becomes deeper, there is less stress, which is similar in magnitude.

Figure 12B:
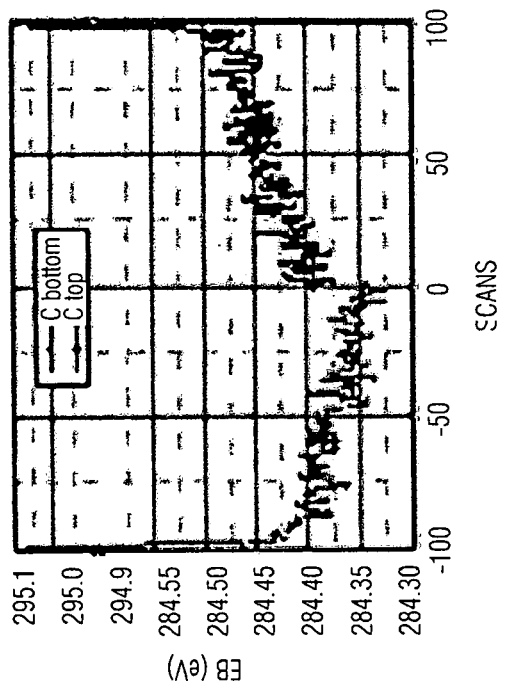
FIGS. 12A-12B are graphs of the BE of Ni $2p^{3/2}$ and C 1s, as a function of scan depth for the plasma-assisted process and run at the low temperature of 500 degrees C.
Figure 12A:
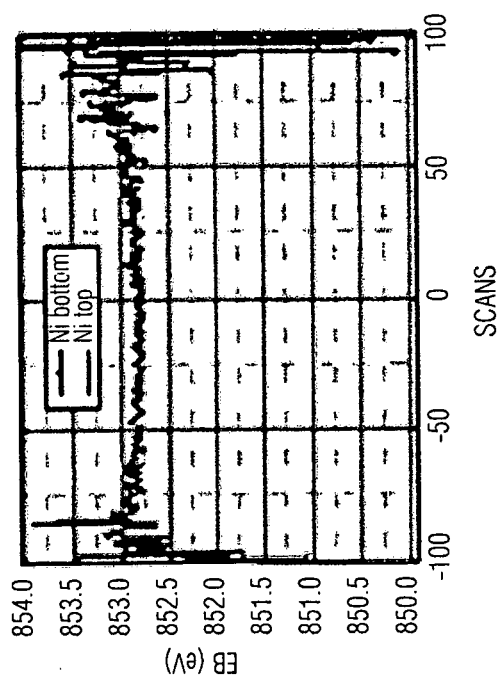
Figure 12D:
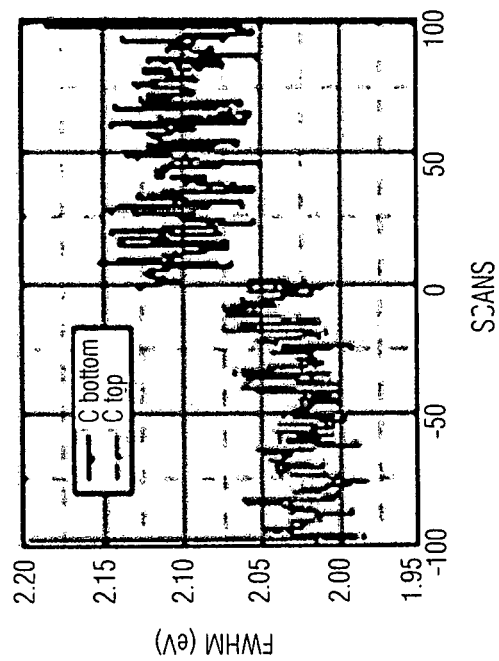
FIGS. 12C-12D are graphs of the FWHM of Ni $2p^{3/2}$ and C 1s, as a function of scan depth for the plasma-assisted process and run at the low temperature of 500 degrees C.
Figure 12C:
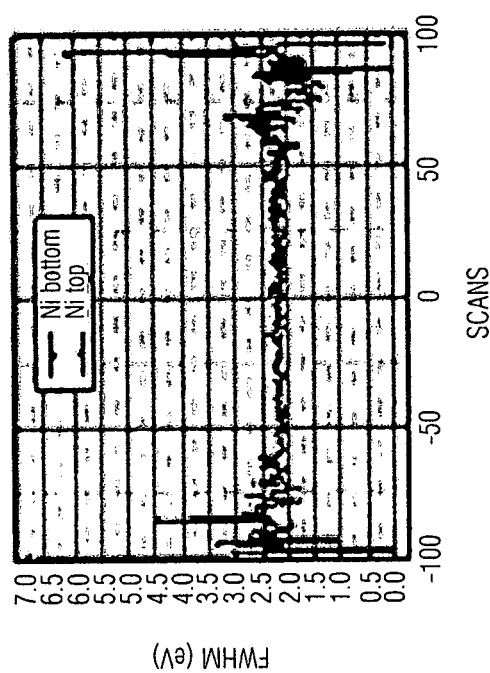
Figure 13:
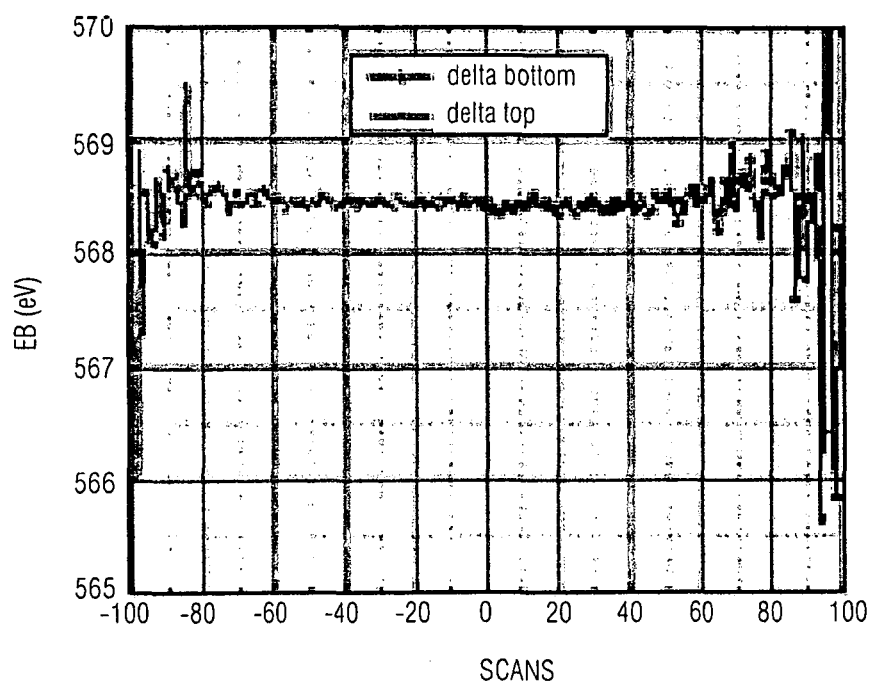
FIG. 13 is a graph plotting the ΔBE(Ni—C), as a function of scan depth through the Ni thickness.

FIGS. 12A-12B are graphs of the BE of Ni $2p^{3/2}$ and C 1s, as a function of scan depth for the plasma-assisted process and run at the low temperature of 500 degrees C. FIGS. 12C-12D are graphs of the FWHM of Ni $2p^{3/2}$ and C 1s, as a function of scan depth for the plasma-assisted process and run at the low temperature of 500 degrees C. FIG. 13 is a graph plotting the ΔBE(Ni—C), as a function of scan depth through the Ni thickness.

Figure 14:
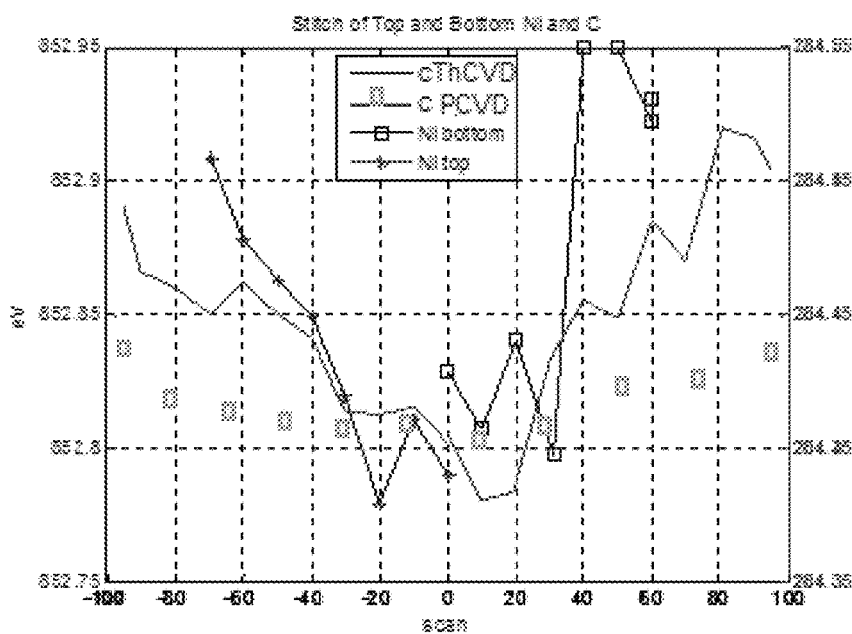
FIG. 14 is a graph comparing the stresses in films produced using thermal and plasma CVD approaches.

FIG. 14 is a graph comparing the stresses in films produced using thermal and plasma CVD approaches.

The above observations when taken together seem to point to the role that stress plays in the mechanism of graphene growth at the interface of Ni/substrate (or interface of the Ni/Si). XPS analysis of free standing delaminated Ni catalyst films shows that the imprint of the modulated stress filed at the interface can be explained by oscillations in the core level shifts of both the Ni and C, since they are intertwined by the local environment at the interface.

Likewise, a general trend of downshifted G-band and 2D-band was found for all PECVD-graphene relative to thermal CVD-grown graphene on the same substrate for comparison of PECVD- and as-grown thermal CVD-graphene on substrates of Cu foil, Cu (100) and Cu (111). The consistent frequency downshifts for PECVD-graphene indicate reduction in the averaged biaxial strain. Further, absence of the D-band in most spectra suggests that the samples were largely free of disorder/edges on the macroscopic scale, which is further corroborated by detailed spatial mapping of the Raman spectra over an area of (100×100) um².

Figure 15:
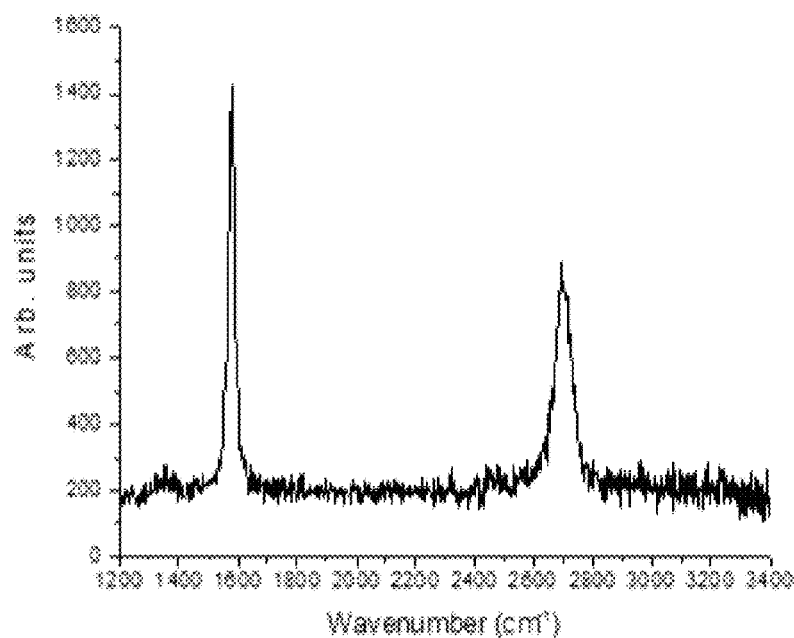
FIG. 15 is a graph showing the Raman spectrum of graphene on the bottom surface of the Ni produced in accordance with certain example embodiments.

FIG. 15 is a graph showing the Raman spectrum of graphene on the bottom surface of the Ni produced in accordance with certain example embodiments. FIG. 15 is indicative of good graphene growth.

The following table shows example operating parameters and results for He implanted samples involving a 300 nm thick Ni catalyst layer.

| Plasma Power Density (W/cm2) | Growth Temperature | Buffer Layer | $I_{2D}/I_G$ | Tape Delamination |
|---|---|---|---|---|
| 50 | 600 degrees C. | SiO₂ | 1.3 | √ |
| 100 | 550 degrees C. | SiO₂ | 1.2 | Yes |
| 200 | 500 degrees C. | SiO₂ | 1.07 | Yes |

Figures 16A, 16B, 16C:
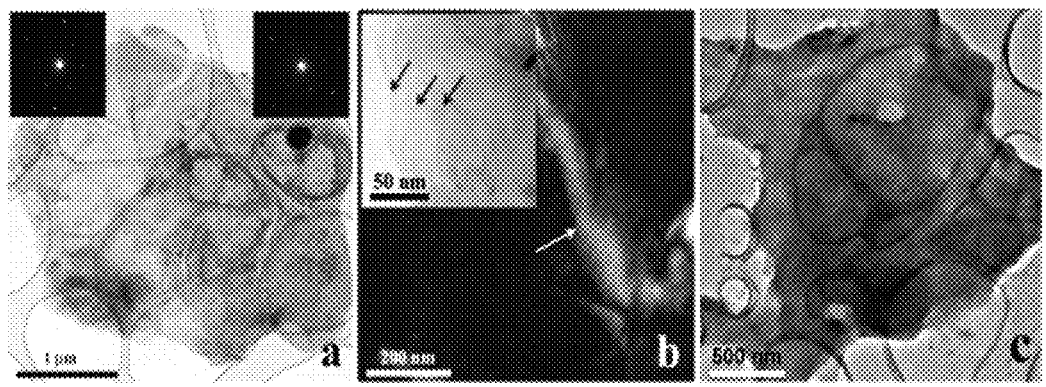
FIGS. 16A-16C are high resolution TEM images of graphene layers produced according to certain example embodiments.
Figure 17:
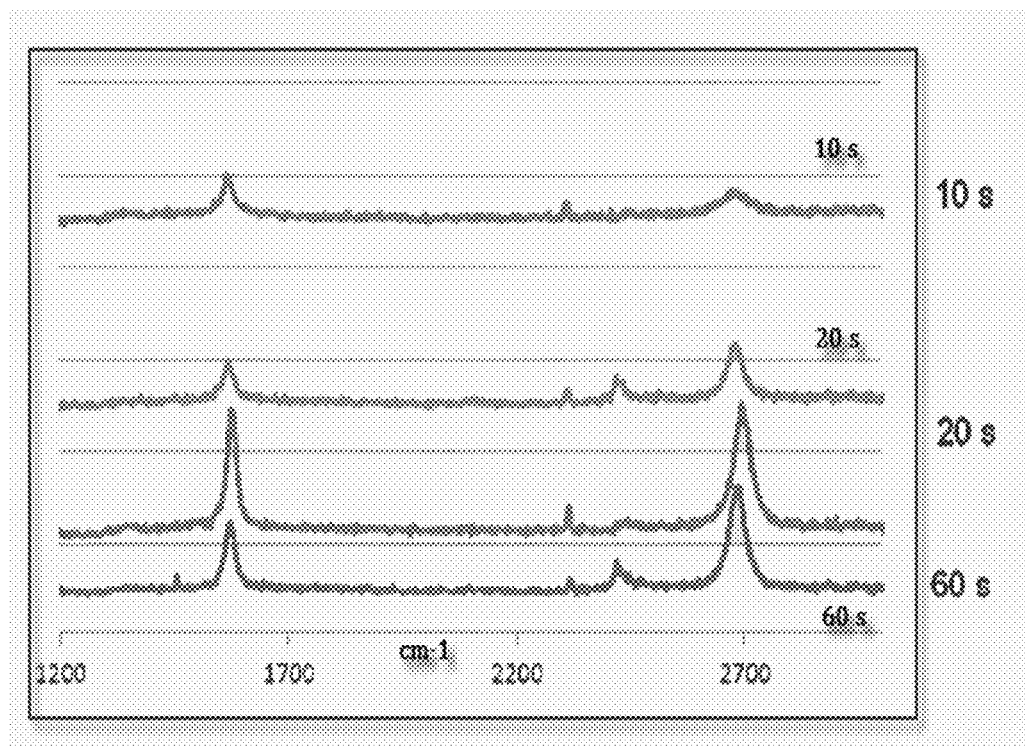
FIG. 17 shows real-time in-situ Raman data for the IGL growth in accordance with certain example embodiments.

FIGS. 16A-16C are high resolution TEM images of graphene layers produced according to certain example embodiments. Monolayer and bilayer graphene exists at the IGL. The $I_{2D}/I_G$ ratio is consistently greater than 1, and the samples are electrically conductive. FIG. 17 shows real-time in-situ Raman data for the IGL growth in accordance with certain example embodiments.

It will be appreciated that the techniques described herein may be used to grow large area graphene films on nickel surfaces in about 1-5 minutes, e.g., by employing a remote plasma system. A remote plasma inclusive process advantageously reduces or eliminates the orientation effect of the electrical field on the grown film (which tends to plague in situ plasma growth), and also advantageously allows film growth at lower temperatures compared to conventional CVD processes. Studies of electrical and optical properties of the films indicate that these properties in the films grown in accordance with certain example embodiments are similar to those produced by more conventional means. The temperature of growth is low enough to allow direct growth on soda glass substrates pre-coated with a buffer layer of SiO₂ or other silicon-inclusive layer.

It will be appreciated that the graphene inclusive thin films described herein may be used in connection with optical applications, electronic applications, optoelectronic applications, and/or the like.

Although certain example embodiments have been described as using He as a mechanism for introducing stress and facilitating the removal of metal catalyst layer, it will be appreciated that other stress/strain inducing mechanisms may be used in different example embodiments. For instance, other gasses may be used in place of or in addition to He gas. It is noted, however, that the combination of He gas with a Ni metal catalyst layer have been found to perform very well in this regard. It also is noted that the presence of water vapor may play a role in facilitating the debonding in certain example embodiments. Certain example embodiments may use another catalyst layer other than Ni. For example, stress-engineered and pretreated Cu or another metal may be used in some instances.

The substrates described herein may be heat treated (e.g., heat strengthened and/or thermally tempered), and/or chemically tempered, in certain example embodiments. The terms "heat treatment" and "heat treating" as used herein mean heating the article to a temperature sufficient to achieve thermal tempering and/or heat strengthening of the glass inclusive article. This definition includes, for example, heating a coated article in an oven or furnace at a temperature of at least about 550 degrees C., more preferably at least about 580 degrees C., more preferably at least about 600 degrees C., more preferably at least about 620 degrees C., and most preferably at least about 650 degrees C. for a sufficient period to allow tempering and/or heat strengthening. This may be for at least about two minutes, or up to about 10 minutes, in certain example embodiments.

Although an element, layer, layer system, coating, or the like, may be said to be "on" or "supported by" a substrate, layer, layer system, coating, or the like, other layers and/or materials may be provided therebetween.

Certain example embodiments relate to a method of making a coated article including a graphene-inclusive thin film supported by a glass substrate. A layer comprising Si is formed on the substrate. A layer comprising Ni is formed on the layer comprising Si. Stress in the layer comprising Ni is engineered via He ion implantation and annealing. Following the engineering of stress, graphene is grown on both major surfaces of the layer comprising Ni via plasma-related chemical vapor deposition. The layer comprising Ni and the graphene on the major surface of the layer comprising Ni opposite the substrate are mechanically removed, with at least some of the graphene initially formed at the interface of the layer comprising Si and the layer comprising Ni remaining on the substrate on the layer comprising Si following the mechanical removal, in making the graphene-inclusive thin film.

In addition to the features of the previous paragraph, in certain example embodiments, the plasma-related chemical vapor deposition may be remote plasma-assisted chemical vapor deposition or plasma-enhanced chemical vapor deposition.

In addition to the features of either of the two previous paragraphs, in certain example embodiments, the plasma-related chemical vapor deposition may use acetylene and hydrogen as separate source gasses.

In addition to the features of any of the three previous paragraphs, in certain example embodiments, the layer comprising Ni may be formed by e-beam deposition.

In addition to the features of any of the four previous paragraphs, in certain example embodiments, the layer comprising Ni may be 200-300 nm thick.

In addition to the features of any of the five previous paragraphs, in certain example embodiments, the mechanical removal may be delamination.

In addition to the features of any of the six previous paragraphs, in certain example embodiments, the mechanical removal may remove at least some of the graphene on the major surface of the layer comprising Ni closest the substrate.

In addition to the features of any of the seven previous paragraphs, in certain example embodiments, the layer comprising Si may be oxided.

In addition to the features of any of the eight previous paragraphs, in certain example embodiments, the layer comprising Si may be 10-300 nm thick.

In addition to the features of any of the nine previous paragraphs, in certain example embodiments, the layer comprising Ni may be formed on the substrate at least partially under vacuum, and He ion implantation also is performed at least partially under vacuum.

In addition to the features of the previous paragraph, in certain example embodiments, the annealing and/or the graphene growing may be performed at least partially under vacuum.

In addition to the features of any of the 11 previous paragraphs, in certain example embodiments, vacuum may be maintained from formation of the layer comprising Ni through graphene growth.

In addition to the features of any of the 12 previous paragraphs, in certain example embodiments, the annealing may performed at 400-650 degrees C., more preferably 450-550 degrees C.

In addition to the features of any of the 13 previous paragraphs, in certain example embodiments, the graphene may be grown at 400-650 degrees C., more preferably 450-550 degrees C.

A coated article including a graphene-inclusive thin film supported by a glass substrate made by the method of any of the 14 previous paragraphs may be provided in certain example embodiments.

Certain example embodiments relate to a method of making a coated article including a graphene-inclusive thin film supported by a glass substrate. A layer comprising Ni is formed on the substrate. He ions are implanted in the layer comprising Ni. The layer comprising Ni with the He ions implanted therein is heated. The implanting and the heating create a desired stress profile in the layer comprising Ni. Following creation of the desired stress profile in the layer comprising Ni, a hydrocarbon source gas and a separate hydrogen source gas are provided to a remote plasma-assisted chemical vapor deposition apparatus to facilitate graphene growth on major surfaces of the layer comprising Ni opposite the substrate and adjacent the substrate. The layer comprising Ni is delaminated from the substrate. The delamination removes the layer comprising Ni from the substrate together with graphene grown on the major surface of the layer comprising Ni opposite the substrate, while leaving on the substrate graphene grown on the major surface of the layer comprising Ni adjacent the substrate, in making the graphene-inclusive thin film.

In addition to the features of the previous paragraph, in certain example embodiments, the layer comprising Ni may be formed by e-beam deposition.

In addition to the features of either of the two previous paragraphs, in certain example embodiments, a silicon-inclusive layer may be formed on the substrate, with the layer comprising Ni being formed on the silicon-inclusive layer.

In addition to the features of the previous paragraph, in certain example embodiments, the silicon-inclusive layer may be 10-300 nm thick.

In addition to the features of any of the four previous paragraphs, in certain example embodiments, the heating may be performed, and graphene may be grown, at 450-550 degrees C.

In addition to the features of any of the five previous paragraphs, in certain example embodiments, the graphene may be grown at 450-550 degrees C. in 1-5 minutes.

A coated article including a graphene-inclusive thin film supported by a glass substrate made by the method of any of the six previous paragraphs may be provided in certain example embodiments.

Certain example embodiments relate to a method of making a coated article including a graphene-inclusive thin film supported by a glass substrate. A buffer layer is formed on the substrate. A metal catalyst layer is formed on the buffer layer. Stress in the metal catalyst layer is pre-engineered via He ion implantation and thermal annealing. Following the pre-engineering of stress, graphene is grown on both major surfaces of the metal catalyst layer using a remote plasma-assisted chemical vapor deposition apparatus operating in connection with separate hydrocarbon and hydrogen gasses provided at different flow rates and with a temperature of 450-550 degrees C. in no more than 10 minutes. The metal catalyst layer is removed from the substrate. The delamination removes the metal catalyst layer from the substrate together with graphene grown on the major surface of the metal catalyst layer opposite the substrate while leaving on the substrate graphene grown at the interface of the metal catalyst layer and the buffer layer, in making the graphene-inclusive thin film.

A coated article including a graphene-inclusive thin film supported by a glass substrate made by the method of the previous paragraph may be provided in certain example embodiments.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a coated article including a graphene-inclusive thin film supported by a glass substrate, the method comprising:
   forming a layer comprising Si on the substrate;
   forming a layer comprising Ni on the layer comprising Si;
   engineering stress in the layer comprising Ni via He ion implantation and annealing;
   following the engineering of stress, growing graphene on both major surfaces of the layer comprising Ni via plasma-related chemical vapor deposition; and
   mechanically removing the layer comprising Ni and the graphene on the major surface of the layer comprising Ni opposite the substrate, at least some graphene initially formed at an interface of the layer comprising Si and the layer comprising Ni remaining on the substrate on the layer comprising Si following the mechanical removal, in making the graphene-inclusive thin film,
   wherein the annealing is performed, and the graphene is grown, at 450-550 degrees C., the graphene is grown in 1-5 minutes, and He exposure associated with the He ion implantation is no more than 5 minutes.

2. The method of claim 1, wherein the plasma-related chemical vapor deposition is remote plasma-assisted chemical vapor deposition.

3. The method of claim 1, wherein the plasma-related chemical vapor deposition is plasma-enhanced chemical vapor deposition.

4. The method of claim 1, wherein the plasma-related chemical vapor deposition uses acetylene and hydrogen as separate source gasses.

5. The method of claim 1, wherein the layer comprising Ni is formed by e-beam deposition.

6. The method of claim 1, wherein the layer comprising Ni is 200-300 nm thick.

7. The method of claim 1, wherein the mechanical removal is delamination.

8. The method of claim 1, wherein the mechanical removal removes at least some of the graphene on the major surface of the layer comprising Ni closest the substrate.

9. The method of claim 1, wherein the layer comprising Si is oxided.

10. The method of claim 1, wherein the layer comprising Si is 10-300 nm thick.

11. The method of claim 1, wherein the layer comprising Ni is formed on the substrate at least partially under vacuum, and He ion implantation also is performed at least partially under vacuum.

12. The method of claim 11, wherein the annealing and/or the graphene growing is performed at least partially under vacuum.

13. The method of claim 11, wherein the at least partial vacuum is maintained from formation of the layer comprising Ni through graphene growth.

14. A method of making a coated article including a graphene-inclusive thin film supported by a glass substrate, the method comprising:
   forming a layer comprising Ni on the substrate;
   implanting He ions in the layer comprising Ni;
   heating the layer comprising Ni with the He ions implanted therein, the implanting and the heating creating a desired stress profile in the layer comprising Ni;
   following creation of the desired stress profile in the layer comprising Ni, providing a hydrocarbon source gas and a separate hydrogen source gas to a remote plasma-assisted chemical vapor deposition apparatus to facilitate graphene growth on major surfaces of the layer comprising Ni opposite the substrate and adjacent the substrate; and
   delaminating the layer comprising Ni from the substrate, the delamination removing the layer comprising Ni from the substrate together with graphene grown on the major surface of the layer comprising Ni opposite the substrate while leaving on the substrate graphene grown on the major surface of the layer comprising Ni adjacent the substrate, in making the graphene-inclusive thin film,
   wherein the heating is performed, and graphene is grown, at 450-550 degrees C., the graphene is grown in 1-5 minutes, and He exposure associated with the He ion implantation is no more than 5 minutes.

15. The method of claim 14, wherein the layer comprising Ni is formed by e-beam deposition.

16. The method of claim 14, further comprising forming a silicon-inclusive layer on the substrate, the layer comprising Ni being formed on the silicon-inclusive layer.

17. The method of claim 16, wherein the silicon-inclusive layer is 10-300 nm thick.

18. A method of making a coated article including a graphene-inclusive thin film supported by a glass substrate, the method comprising:
   forming a buffer layer on the substrate;
   forming a metal catalyst layer on the buffer layer;
   pre-engineering stress in the metal catalyst layer via He ion implantation and thermal annealing;

following the pre-engineering of stress, growing graphene on both major surfaces of the metal catalyst layer using a remote plasma-assisted chemical vapor deposition apparatus operating in connection with separate hydrocarbon and hydrogen gasses provided at different flow rates;

removing the metal catalyst layer from the substrate together with graphene grown on the major surface of the metal catalyst layer opposite the substrate, while leaving on the substrate graphene grown on the major surface of the metal catalyst layer adjacent the substrate, in making the graphene-inclusive thin film; and wherein the annealing is performed, and the graphene is grown, at 450-550 degrees C., the graphene is grown in 1-5 minutes, and He exposure associated with the He ion implantation is no more than 5 minutes.

19. A method of making a coated article including a graphene-inclusive film supported by a glass substrate, the method comprising:

forming a layer comprising Si on the glass substrate;

forming a layer comprising Ni on the glass substrate and on the layer comprising Si;

engineering stress in the layer comprising Ni via He ion implantation and annealing;

following the engineering of stress, growing graphene on both major surfaces of the layer comprising Ni; and removing the layer comprising Ni and the graphene on the major surface of the layer comprising Ni opposite the glass substrate, at least some graphene initially formed at an interface of the layer comprising Si and the layer comprising Ni remaining on the glass substrate on the layer comprising Si following the removal, in making the graphene-inclusive film, wherein the annealing is performed, and the graphene is grown, at 450-550 degrees C., the graphene is grown in 1-5 minutes, and He exposure associated with the He ion implantation is no more than 5 minutes.

\* \* \* \* \*